US012780716B2

(12) United States Patent
Guo et al.

(10) Patent No.: US 12,780,716 B2
(45) Date of Patent: Nov. 3, 2026

(54) ION EXCHANGEABLE GLASS COMPOSITIONS WITH IMPROVED TOUGHNESS, SURFACE STRESS AND FRACTURE RESISTANCE

(71) Applicant: CORNING INCORPORATED, Corning, NY (US)

(72) Inventors: Xiaoju Guo, Pittsford, NY (US); Peter Joseph Lezzi, Corning, NY (US); Jian Luo, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 1003 days.

(21) Appl. No.: 17/536,318

(22) Filed: Nov. 29, 2021

(65) Prior Publication Data

US 2022/0169556 A1 Jun. 2, 2022

Related U.S. Application Data

(60) Provisional application No. 63/119,037, filed on Nov. 30, 2020.

(51) Int. Cl.
*C03C 3/095* (2006.01)
*C03C 3/093* (2006.01)
(Continued)

(52) U.S. Cl.
CPC .............. *C03C 3/095* (2013.01); *C03C 3/093* (2013.01); *C03C 4/18* (2013.01); *C03C 21/002* (2013.01); *H05K 5/03* (2013.01)

(58) Field of Classification Search
None
See application file for complete search history.

(56) References Cited

U.S. PATENT DOCUMENTS 6,300,264 B1 * 10/2001 Ohara .................... C03C 3/095 501/63
2005/0250639 A1 * 11/2005 Siebers .................. C03C 3/118 501/68

(Continued)

FOREIGN PATENT DOCUMENTS

CN 105948488 A 9/2016
CN 108623147 A 10/2018

(Continued)

OTHER PUBLICATIONS

Li, B., et al., "Effects of ZrO2 on properties of BaO—Al203—B2O3—SiO2 composites for LTCC applications," J. Materials Science: Materials in Electronics 27 (2016), pp. 2824-2829. (Year: 2016).*

(Continued)

*Primary Examiner* — Amber R Orlando
*Assistant Examiner* — Paul Alan Forsyth
(74) *Attorney, Agent, or Firm* — Travis B. Gasa; Russell S. Magaziner

(57) ABSTRACT

A glass composition includes greater than or equal to 50 mol % to less than or equal to 65 mol % $SiO_2$; greater than or equal to 15 mol % to less than or equal to 21 mol % $Al_2O_3$; greater than or equal to 4 mol % to less than or equal to 10 mol % $B_2O_3$; greater than or equal to 7 mol % to less than or equal to 12 mol % $Li_2O$; greater than or equal to 1 mol % to less than or equal to 10 mol % $Na_2O$; and greater than or equal to 0.2 mol % $Y_2O_3$+$ZrO_2$. The glass is characterized by the relationship $R_2O+R'O-Al_2O_3 \leq 3$ mol %, wherein $R_2O$ is the total amount of alkali oxides and R'O is the total amount of alkaline earth oxides. The glass composition may have a fracture toughness of greater than or equal 0.75 MPa√m. The glass composition is ion exchangeable.

30 Claims, 2 Drawing Sheets

(51) Int. Cl.

| | |
|---|---|
| ***C03C 4/18*** | (2006.01) |
| ***C03C 21/00*** | (2006.01) |
| ***H05K 5/03*** | (2006.01) |

(56) References Cited

U.S. PATENT DOCUMENTS

| | | | | |
|---|---|---|---|---|
| 2013/0225388 | A1 * | 8/2013 | Nakane | C03C 3/095 501/67 |
| 2014/0308525 | A1 | 10/2014 | Hochrein et al. | |
| 2016/0102011 | A1 | 4/2016 | Hu et al. | |
| 2016/0102014 | A1 | 4/2016 | Hu et al. | |
| 2019/0300422 | A1 * | 10/2019 | Guo | G02F 1/133308 |
| 2019/0369672 | A1 | 12/2019 | Guo et al. | |
| 2020/0079689 | A1 | 3/2020 | Guo et al. | |
| 2020/0189962 | A1 * | 6/2020 | Dejneka | C03C 3/095 |
| 2023/0056119 | A1 * | 2/2023 | Guo | C03C 3/095 |

FOREIGN PATENT DOCUMENTS

| | | | | |
|---|---|---|---|---|
| CN | 111936438 | A | 11/2020 | |
| CN | 112794652 | A | 5/2021 | |
| EP | 1398303 | A1 * | 3/2004 | C03C 10/0027 |
| WO | 2015/127583 | A1 | 9/2015 | |
| WO | 2019/191480 | A1 | 10/2019 | |
| WO | 2019/236975 | A2 | 12/2019 | |
| WO | 2020/069260 | A1 | 4/2020 | |
| WO | 2020/123224 | A2 | 6/2020 | |
| WO | 2021/108310 | A1 | 6/2021 | |

OTHER PUBLICATIONS

International Search Report and Written Opinion of the International Searching Authority; PCT/US2021/060311; mailed on Mar. 25, 2022, 25 pages; European Patent Office.

ASTM C598-93(2013), titled "Standard Test for Annealing Point and Strain Point of Glass by Beam Bending."

ASTM C693-93(2013), "Standard Test Method for Density of Glass by Buoyancy".

ASTM C829-81 (2015), titled "Standard Practice for Measurement of Liquidus Temperature of Glass by the Gradient Furnace Method".

ASTM C965-96 (2012), titled "Standard Practice for Measuring Viscosity of Glass Above the Softening Point".

ASTM International, "Standard Test Method for Measurement of Viscosity of Glass Between 104 Pa.cndot.s and 108 Pa.cndot.s by Viscous Compression of a Solid Right Cylinder", 2012, Designation: C1351M-96.

ASTM standard C770-16, entitled "Standard Test Method for Measurement of Glass Stress-Optical Coefficient,".

Chinese Patent Application No. 202180080001.X, Office Action dated May 1, 2025, 5 pages (English Translation only), Chinese Patent Office.

* cited by examiner

ION EXCHANGEABLE GLASS COMPOSITIONS WITH IMPROVED TOUGHNESS, SURFACE STRESS AND FRACTURE RESISTANCE

This application claims the benefit of priority under 35 U.S.C. § 119 of U.S. Provisional Application Ser. No. 63/119,037 filed on Nov. 30, 2020, the content of which is relied upon and incorporated herein by reference in its entirety.

FIELD

The present specification generally relates to glass compositions suitable for use as cover glass for electronic devices. More specifically, the present specification is directed to ion exchangeable glasses that may be formed into cover glass for electronic devices.

TECHNICAL BACKGROUND

The mobile nature of portable devices, such as smart phones, tablets, portable media players, personal computers, and cameras, makes these devices particularly vulnerable to accidental dropping on hard surfaces, such as the ground. These devices typically incorporate cover glasses, which may become damaged upon impact with hard surfaces. In many of these devices, the cover glasses function as display covers, and may incorporate touch functionality, such that use of the devices is negatively impacted when the cover glasses are damaged.

There are two major failure modes of cover glass when the associated portable device is dropped on a hard surface. One of the modes is flexure failure, which is caused by bending of the glass when the device is subjected to dynamic load from impact with the hard surface. The other mode is sharp contact failure, which is caused by introduction of damage to the glass surface. Impact of the glass with rough hard surfaces, such as asphalt, granite, etc., can result in sharp indentations in the glass surface. These indentations become failure sites in the glass surface from which cracks may develop and propagate.

Glass can be made more resistant to flexure failure by the ion-exchange technique, which involves inducing compressive stress in the glass surface. However, the ion-exchanged glass will still be vulnerable to dynamic sharp contact, owing to the high stress concentration caused by local indentations in the glass from the sharp contact.

It has been a continuous effort for glass makers and handheld device manufacturers to improve the resistance of handheld devices to sharp contact failure. Solutions range from coatings on the cover glass to bezels that prevent the cover glass from impacting the hard surface directly when the device drops on the hard surface. However, due to the constraints of aesthetic and functional requirements, it is very difficult to completely prevent the cover glass from impacting the hard surface.

It is also desirable that portable devices be as thin as possible. Accordingly, in addition to strength, it is also desired that glasses to be used as cover glass in portable devices be made as thin as possible. Thus, in addition to increasing the strength of the cover glass, it is also desirable for the glass to have mechanical characteristics that allow it to be formed by processes that are capable of making thin glass articles, such as thin glass sheets.

Accordingly, a need exists for glasses that can be strengthened, such as by ion exchange, and that have the mechanical properties that allow them to be formed as thin glass articles.

SUMMARY

According to aspect (1), a glass is provided. The glass comprises: greater than or equal to 50 mol % to less than or equal to 65 mol % $SiO_2$; greater than or equal to 15 mol % to less than or equal to 21 mol % $Al_2O_3$; greater than or equal to 4 mol % to less than or equal to 10 mol % $B_2O_3$; greater than or equal to 7 mol % to less than 11 mol % $Li_2O$; greater than or equal to 1 mol % to less than or equal to 10 mol % $Na_2O$; greater than or equal to 0 mol % to less than or equal to 7 mol % MgO; greater than or equal to 0 mol % to less than or equal to 5 mol % CaO; greater than or equal to 0 mol % to less than or equal to 5 mol % $Y_2O_3$; and greater than or equal to 0 mol % to less than or equal to 0.8 mol % $ZrO_2$, wherein: $Y_2O_3+ZrO_2$ is greater than or equal to 0.2 mol %, and $R_2O+R'O-Al_2O_3$ is less than or equal to 3 mol %, wherein $R_2O$ is the total amount of alkali oxides and R'O is the total amount of alkaline earth oxides.

According to aspect (2), the glass of aspect (1) is provided, comprising greater than 0 mol % to less than or equal to 0.8 mol % $ZrO_2$.

According to aspect (3), a glass is provided. The glass comprises: greater than or equal to 50 mol % to less than or equal to 65 mol % $SiO_2$; greater than or equal to 15 mol % to less than or equal to 21 mol % $Al_2O_3$; greater than or equal to 4 mol % to less than or equal to 10 mol % $B_2O_3$; greater than or equal to 7 mol % to less than or equal to 12 mol % $Li_2O$; greater than or equal to 1 mol % to less than or equal to 10 mol % $Na_2O$; greater than or equal to 0 mol % to less than or equal to 7 mol % MgO; greater than or equal to 0 mol % to less than or equal to 5 mol % CaO; greater than or equal to 0 mol % to less than or equal to 5 mol % $Y_2O_3$; and greater than 0 mol % to less than or equal to 0.8 mol % $ZrO_2$, wherein: $Y_2O_3+ZrO_2$ is greater than or equal to 0.2 mol %, and $R_2O+R'O-Al_2O_3$ is less than or equal to 3 mol %, wherein $R_2O$ is the total amount of alkali oxides and R'O is the total amount of alkaline earth oxides.

According to aspect (4), the glass of aspect (3) is provided, comprising greater than or equal to 7 mol % to less than or equal to 11 mol % $Li_2O$.

According to aspect (5), the glass of any of the preceding aspects is provided, comprising greater than or equal to 0 mol % to less than or equal to 0.1 mol % $SnO_2$.

According to aspect (6), the glass of any of the preceding aspects is provided, comprising greater than or equal to 15 mol % to less than or equal to 20 mol % $Al_2O_3$.

According to aspect (7), the glass of any of the preceding aspects is provided, wherein: $-2$ mol %$\leq R_2O+R'O-Al_2O_3\leq 3$ mol %.

According to aspect (8), the glass of any of the preceding aspects is provided, wherein: $-2$ mol %$\leq R_2O+R'O-Al_2O_3\leq 2$ mol %.

According to aspect (9), the glass of any of the preceding aspects is provided, wherein: 0.2 mol %$\leq Y_2O_3+ZrO_2\leq 5$ mol %.

According to aspect (10), the glass of any of the preceding aspects is provided, wherein: 1 mol %$\leq$MgO+CaO$\leq$6 mol %.

According to aspect (11), the glass of any of the preceding aspects is provided, comprising a $K_{IC}$ greater than or equal to 0.75 MPa$\sqrt{m}$.

According to aspect (12), the glass of any of the preceding aspects is provided, comprising a $K_{IC}$ greater than or equal to 0.8 MPa√m.

According to aspect (13), the glass of any of the preceding aspects is provided, comprising a $K_{IC}$ greater than or equal to 0.85 MPa√m.

According to aspect (14), the glass of any of the preceding aspects is provided, comprising a $K_{IC}$ greater than or equal to 0.9 MPa√m.

According to aspect (15), a method is provided. The method comprises: ion exchanging a glass-based substrate in a molten salt bath to form a glass-based article, wherein the glass-based article comprises a compressive stress layer extending from a surface of the glass-based article to a depth of compression, and the glass-based substrate comprises the glass of any of the preceding claims.

According to aspect (16), the method of aspect (15) is provided, wherein the molten salt bath comprises $NaNO_3$ and $KNO_3$.

According to aspect (17), the method of any of aspect (15) to the preceding aspect is provided, wherein the molten salt bath comprises greater than or equal to 75 wt % $KNO_3$.

According to aspect (18), the method of any of aspect (15) to the preceding aspect is provided, wherein the molten salt bath comprises less than or equal to 95 wt % $KNO_3$.

According to aspect (19), the method of any of aspect (15) to the preceding aspect is provided, wherein the molten salt bath comprises less than or equal to 25 wt % $NaNO_3$.

According to aspect (20), the method of any of aspect (15) to the preceding aspect is provided, wherein the molten salt bath comprises greater than or equal to 5 wt % $NaNO_3$.

According to aspect (21), the method of any of aspect (15) to the preceding aspect is provided, wherein the molten salt bath is at a temperature greater than or equal to 430° C. to less than or equal to 450° C.

According to aspect (22), the method of any of aspect (15) to the preceding aspect is provided, wherein the ion exchanging extends for a time period greater than or equal to 4 hours to less than or equal to 12 hours.

According to aspect (23), a glass-based article is provided. The glass-based article comprises: a compressive stress layer extending from a surface of the glass-based article to a depth of compression; a composition at a center of the glass-based article comprising: greater than or equal to 50 mol % to less than or equal to 65 mol % $SiO_2$; greater than or equal to 15 mol % to less than or equal to 21 mol % $Al_2O_3$; greater than or equal to 4 mol % to less than or equal to 10 mol % $B_2O_3$; greater than or equal to 7 mol % to less than 11 mol % $Li_2O$; greater than or equal to 1 mol % to less than or equal to 10 mol % $Na_2O$; greater than or equal to 0 mol % to less than or equal to 7 mol % MgO; greater than or equal to 0 mol % to less than or equal to 5 mol % CaO; greater than or equal to 0 mol % to less than or equal to 5 mol % $Y_2O_3$; and greater than or equal to 0 mol % to less than or equal to 0.8 mol % $ZrO_2$, wherein: $Y_2O_3+ZrO_2$ is greater than or equal to 0.2 mol %, and $R_2O+R'O-Al_2O_3$ is less than or equal to 3 mol %, wherein $R_2O$ is the total amount of alkali oxides and R'O is the total amount of alkaline earth oxides.

According to aspect (24), the glass-based article of aspect (23) is provided, wherein the composition at the center of the glass-based article comprises greater than 0 mol % to less than or equal to 0.8 mol % $ZrO_2$.

According to aspect (25), a glass-based article is provided. The glass-based article comprises: a compressive stress layer extending from a surface of the glass-based article to a depth of compression; a composition at a center of the glass-based article comprising: greater than or equal to 50 mol % to less than or equal to 65 mol % $SiO_2$; greater than or equal to 15 mol % to less than or equal to 21 mol % $Al_2O_3$; greater than or equal to 4 mol % to less than or equal to 10 mol % $B_2O_3$; greater than or equal to 7 mol % to less than or equal to 12 mol % $Li_2O$; greater than or equal to 1 mol % to less than or equal to 10 mol % $Na_2O$; greater than or equal to 0 mol % to less than or equal to 7 mol % MgO; greater than or equal to 0 mol % to less than or equal to 5 mol % CaO; greater than or equal to 0 mol % to less than or equal to 5 mol % $Y_2O_3$; and greater than 0 mol % to less than or equal to 0.8 mol % $ZrO_2$, wherein: $Y_2O_3+ZrO_2$ is greater than or equal to 0.2 mol %, and $R_2O+R'O-Al_2O_3$ is less than or equal to 3 mol %, wherein $R_2O$ is the total amount of alkali oxides and R'O is the total amount of alkaline earth oxides.

According to aspect (26), the glass-based article of aspect (25) is provided, wherein the composition at the center of the glass-based article comprises greater than or equal to 7 mol % to less than or equal to 11 mol % $Li_2O$.

According to aspect (27), the glass-based article of any of aspect (23) to the preceding aspect is provided, wherein the composition at the center of the glass-based article comprises greater than or equal to 0 mol % to less than or equal to 0.1 mol % $SnO_2$.

According to aspect (28), the glass-based article of any of aspect (23) to the preceding aspect is provided, wherein the composition at the center of the glass-based article comprises greater than or equal to 15 mol % to less than or equal to 20 mol % $Al_2O_3$.

According to aspect (29), the glass-based article of any of aspect (23) to the preceding aspect is provided, wherein the composition at the center of the glass-based article comprises: $-2 \text{ mol } \% \leq R_2O+R'O-Al_2O_3 \leq 3 \text{ mol } \%$.

According to aspect (30), the glass-based article of any of aspect (23) to the preceding aspect is provided, wherein the composition at the center of the glass-based article comprises: $-2 \text{ mol } \% \leq R_2O+R'O-Al_2O_3 \leq 2 \text{ mol } \%$.

According to aspect (31), the glass-based article of any of aspect (23) to the preceding aspect is provided, wherein the composition at the center of the glass-based article comprises: $0.2 \text{ mol } \% \leq Y_2O_3+ZrO_2 \leq 5 \text{ mol } \%$.

According to aspect (32), the glass-based article of any of aspect (23) to the preceding aspect is provided, wherein the composition at the center of the glass-based article comprises: $1 \text{ mol } \% \leq MgO+CaO \leq 6 \text{ mol } \%$.

According to aspect (33), the glass-based article of any of aspect (23) to the preceding aspect is provided, wherein a glass having the same composition and microstructure as the composition at the center of the glass-based article comprises a $K_{IC}$ greater than or equal to 0.75 MPa√m.

According to aspect (34), the glass-based article of any of aspect (23) to the preceding aspect is provided, wherein a glass having the same composition and microstructure as the composition at the center of the glass-based article comprises a $K_{IC}$ greater than or equal to 0.8 MPa√m.

According to aspect (35), the glass-based article of any of aspect (23) to the preceding aspect is provided, wherein a glass having the same composition and microstructure as the composition at the center of the glass-based article comprises a $K_{IC}$ greater than or equal to 0.85 MPa√m.

According to aspect (36), the glass-based article of any of aspect (23) to the preceding aspect is provided, wherein a glass having the same composition and microstructure as the composition at the center of the glass-based article comprises a $K_{IC}$ greater than or equal to 0.9 MPa√m.

According to aspect (37), the glass-based article of any of aspect (23) to the preceding aspect is provided, wherein the compressive stress layer comprises a compressive stress greater than or equal to 550 MPa.

According to aspect (38), the glass-based article of any of aspect (23) to the preceding aspect is provided, further comprising a maximum central tension greater than or equal to 90 MPa.

According to aspect (39), the glass-based article of the preceding aspect is provided, wherein the maximum central tension is less than or equal to 160 MPa.

According to aspect (40), the glass-based article of any of aspect (23) to the preceding aspect is provided, further comprising a potassium ion penetration layer extending from a surface of the glass-based article to a depth of potassium layer $DOL_K$, wherein $DOL_K$ is greater than or equal to 4 μm.

According to aspect (41), the glass-based article of the preceding aspect is provided, wherein $DOL_K$ is less than or equal to 11 μm.

According to aspect (42), a consumer electronic product is provided. The consumer electronic product comprises: a housing having a front surface, a back surface and side surfaces; electrical components provided at least partially within the housing, the electrical components including at least a controller, a memory, and a display, the display being provided at or adjacent the front surface of the housing; and a cover substrate disposed over the display, wherein at least a portion of at least one of the housing and the cover substrate comprises the glass-based article of any of aspect (23) to the preceding aspect.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein, and together with the description serve to explain the principles and operations of the claimed subject matter.

DETAILED DESCRIPTION

Figure 1:
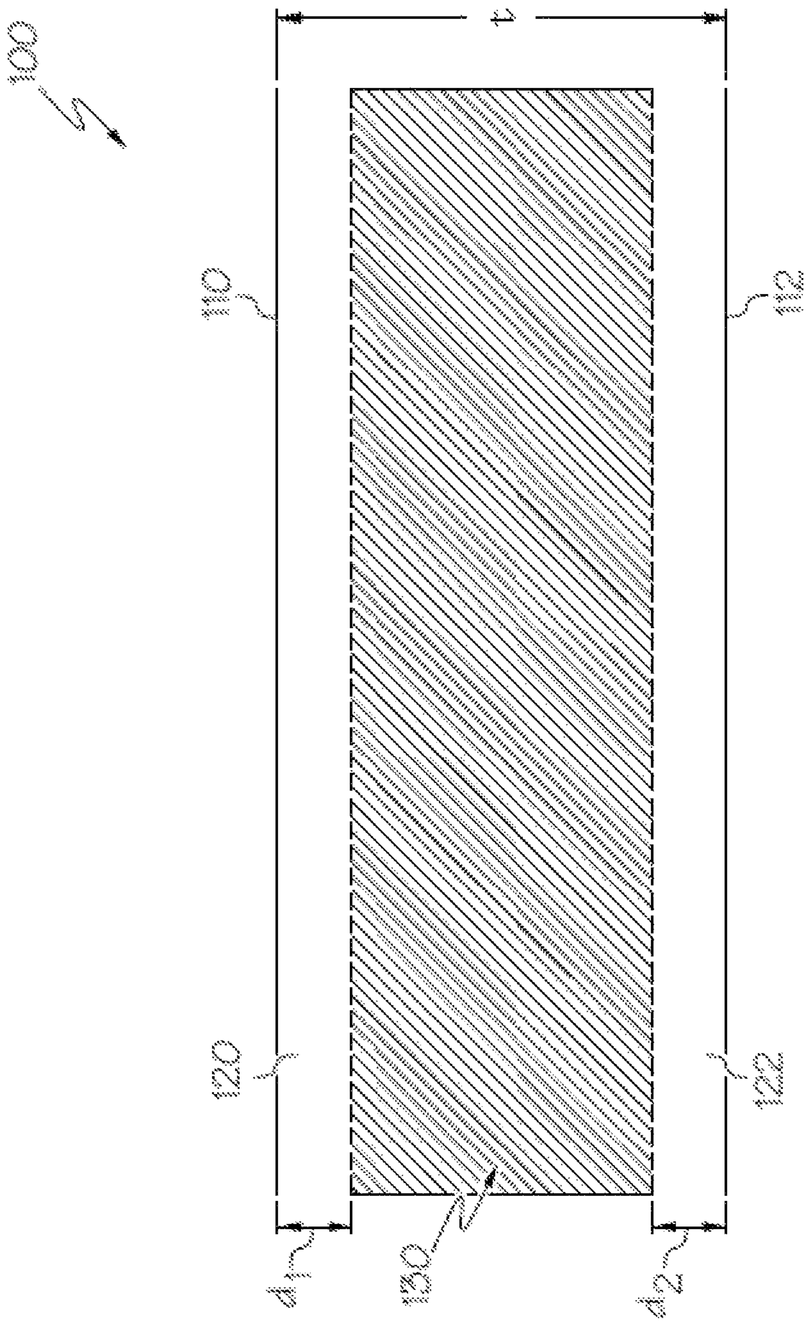
FIG. 1 schematically depicts a cross section of a glass having compressive stress layers on surfaces thereof according to embodiments disclosed and described herein.

Reference will now be made in detail to lithium aluminosilicate glasses according to various embodiments. Lithium aluminosilicate glasses have good ion exchangeability, and chemical strengthening processes have been used to achieve high strength and high toughness properties in lithium aluminosilicate glasses. Lithium aluminosilicate glasses are highly ion exchangeable glasses with high glass quality. The substitution of $Al_2O_3$ into the silicate glass network increases the interdiffusivity of monovalent cations during ion exchange. By chemical strengthening in a molten salt bath (e.g., $KNO_3$ or $NaNO_3$), glasses with high strength, high toughness, and high indentation cracking resistance can be achieved. The stress profiles achieved through chemical strengthening may have a variety of shapes that increase the drop performance, strength, toughness, and other attributes of the glass articles.

Therefore, lithium aluminosilicate glasses with good physical properties, chemical durability, and ion exchangeability have drawn attention for use as cover glass. In particular, lithium containing aluminosilicate glasses, which have higher fracture toughness and fast ion exchangeability, are provided herein. Through different ion exchange processes, greater central tension (CT), depth of compression (DOC), and high compressive stress (CS) can be achieved. However, the addition of lithium in the aluminosilicate glass may reduce the melting point, softening point, or liquidus viscosity of the glass.

In embodiments of glass compositions described herein, the concentration of constituent components (e.g., $SiO_2$, $Al_2O_3$, $Li_2O$, and the like) are given in mole percent (mol %) on an oxide basis, unless otherwise specified. Components of the alkali aluminosilicate glass composition according to embodiments are discussed individually below. It should be understood that any of the variously recited ranges of one component may be individually combined with any of the variously recited ranges for any other component. As used herein, a trailing 0 in a number is intended to represent a significant digit for that number. For example, the number "1.0" includes two significant digits, and the number "1.00" includes three significant digits.

As utilized herein, a "glass substrate" refers to a glass piece that has not been ion exchanged. Similarly, a "glass article" refers to a glass piece that has been ion exchanged and is formed by subjecting a glass substrate to an ion exchange process. A "glass-based substrate" and a "glass-based article" are defined accordingly and include glass substrates and glass articles as well as substrates and articles that are made wholly or partly of glass, such as glass substrates that include a surface coating. While glass substrates and glass articles may generally be referred to herein for the sake of convenience, the descriptions of glass substrates and glass articles should be understood to apply equally to glass-based substrates and glass-based articles.

Disclosed herein are lithium aluminoborosilicate glass compositions that exhibit a high fracture toughness ($K_{IC}$) and excellent scratch performance. In some embodiments, the glass compositions are characterized by a $K_{IC}$ fracture toughness value of at least 0.75 MPa$\sqrt{m}$.

Without wishing to be bound by any particular theory, non-bridging oxygen sites in a glass may be weak spots that produce shear bands and lead to lateral cracking at low load in a single scratch event. The glasses described herein are close to being charge balanced even while being peraluminous, producing the lowest possible non-bridging oxygen content. The glasses have an advantageous lateral crack threshold, and improved scratch performance, as a result.

While scratch performance is desirable, drop performance is the leading attribute for glass articles incorporated into mobile electronic devices. Fracture toughness and stress at depth are critical for improved drop performance on rough surfaces. For this reason, maximizing the amount of stress that can be provided in a glass before reaching the frangibility limit increases the stress at depth and improves the rough surface drop performance. The fracture toughness is known to control the frangibility limit and increasing the fracture toughness increases the frangibility limit. The glass compositions disclosed herein have a high fracture toughness and are capable of achieving high levels of chemically strengthening induced stress. These characteristics of the glass compositions enable the development of improved stress profiles designed to address particular failure modes. This capability allows the ion exchanged glass articles produced from the glass compositions described herein to be customized with different stress profiles to address particular failure modes of concern.

The glass composition spaces described herein were selected for the ability to achieve high fracture toughness ($K_{IC}$), high maximum central tension values, and superior scratch performance. The glasses achieve these properties at least in part due to the high content of $B_2O_3$ and sufficient content of $Li_2O$ while also being peraluminous.

In the glass compositions described herein, $SiO_2$ is the largest constituent and, as such, $SiO_2$ is the primary constituent of the glass network formed from the glass composition. Pure $SiO_2$ has a relatively low CTE. However, pure $SiO_2$ has a high melting point. Accordingly, if the concentration of $SiO_2$ in the glass composition is too high, the formability of the glass composition may be diminished as higher concentrations of $SiO_2$ increase the difficulty of melting the glass, which, in turn, adversely impacts the formability of the glass. In embodiments, the glass composition generally comprises $SiO_2$ in an amount of from greater than or equal to 50 mol % to less than or equal to 65 mol %, such as greater than or equal to 51 mol % to less than or equal to 64 mol %, greater than or equal to 52 mol % to less than or equal to 63 mol %, greater than or equal to 53 mol % to less than or equal to 62 mol %, greater than or equal to 54 mol % to less than or equal to 61 mol %, greater than or equal to 55 mol % to less than or equal to 60 mol %, greater than or equal to 56 mol % to less than or equal to 59 mol %, greater than or equal to 57 mol % to less than or equal to 58 mol %, and all ranges and sub-ranges between the foregoing values.

The glass compositions include $Al_2O_3$. $Al_2O_3$ may serve as a glass network former, similar to $SiO_2$. $Al_2O_3$ may increase the viscosity of the glass composition due to its tetrahedral coordination in a glass melt formed from a glass composition, decreasing the formability of the glass composition when the amount of $Al_2O_3$ is too high. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes. The inclusion of $Al_2O_3$ in the glass compositions enables the high fracture toughness values described herein. In embodiments, the glass composition generally comprises $Al_2O_3$ in a concentration of from greater than or equal to 15 mol % to less than or equal to 21 mol %, such as greater than or equal to 15 mol % to less than or equal to 20 mol %, greater than or equal to 15.5 mol % to less than or equal to 20.5 mol %, greater than or equal to 16 mol % to less than or equal to 20 mol %, greater than or equal to 16.5 mol % to less than or equal to 19.5 mol %, greater than or equal to 17 mol % to less than or equal to 19 mol %, greater than or equal to 17.5 mol % to less than or equal to 18.5 mol %, greater than or equal to 15 mol % to less than or equal to 18 mol %, and all ranges and sub-ranges between the foregoing values.

The glass compositions include $Li_2O$. The inclusion of $Li_2O$ in the glass composition allows for better control of an ion exchange process and further reduces the softening point of the glass, thereby increasing the manufacturability of the glass. The presence of $Li_2O$ in the glass compositions also allows the formation of a stress profile with a parabolic shape. The $Li_2O$ in the glass compositions enables the high fracture toughness values described herein. In embodiments, the glass composition comprises $Li_2O$ in an amount from greater than or equal to 7 mol % to less than or equal to 12 mol %, such as greater than or equal to 7.5 mol % to less than or equal to 11.5 mol %, greater than or equal to 8 mol % to less than or equal to 11 mol %, greater than or equal to 8.5 mol % to less than or equal to 10.5 mol %, greater than or equal to 9 mol % to less than or equal to 10 mol %, greater than or equal to 9.5 mol % to less than or equal to 12 mol %, greater than or equal to 7 mol % to less than 11 mol %, and all ranges and sub-ranges between the foregoing values.

The glass composition also includes $Na_2O$. $Na_2O$ aids in the ion exchangeability of the glass composition, and also improves the formability, and thereby manufacturability, of the glass composition. However, if too much $Na_2O$ is added to the glass composition, the coefficient of thermal expansion (CTE) may be too low, and the melting point may be too high. The inclusion of $Na_2O$ in the glass compositions also enables high compressive stress values to be achieved through ion exchange strengthening. In embodiments, the glass composition comprises $Na_2O$ in an amount from greater than or equal to 1 mol % to less than or equal to 10 mol %, such as greater than or equal to 1.5 mol % to less than or equal to 9.5 mol %, greater than or equal to 2 mol % to less than or equal to 9 mol %, greater than or equal to 2.5 mol % to less than or equal to 8.5 mol %, greater than or equal to 3 mol % to less than or equal to 8 mol %, greater than or equal to 3.5 mol % to less than or equal to 7.5 mol %, greater than or equal to 4 mol % to less than or equal to 7 mol %, greater than or equal to 4.5 mol % to less than or equal to 6.5 mol %, greater than or equal to 5 mol % to less than or equal to 6 mol %, and all ranges and sub-ranges between the foregoing values.

The glass compositions include $B_2O_3$. The inclusion of $B_2O_3$ in the glasses provides improved scratch performance and also increases the indentation fracture threshold of the glasses. The $B_2O_3$ in the glass compositions also increases the fracture toughness of the glasses. If the $B_2O_3$ content in the glass is too high the maximum central tension that may be achieved when ion exchanging the glass is reduced. Excessively high levels of $B_2O_3$ can also lead to volitivity problems during the melting and forming processes of the glass. In embodiments, the glass includes $B_2O_3$ in an amount of from greater than or equal to 4 mol % to less than or equal to 10 mol %, such as greater than or equal to 4.5 mol % to less than or equal to 9.5 mol %, greater than or equal to 5 mol % to less than or equal to 9 mol %, greater than or equal to 5.5 mol % to less than or equal to 8.5 mol %, greater than or equal to 6 mol % to less than or equal to 8 mol %, greater than or equal to 6.5 mol % to less than or equal to 7.5 mol %, greater than or equal to 7 mol % to less than or equal to 10 mol %, and all ranges and sub-ranges between the foregoing values.

The glasses may include MgO. The inclusion of MgO lowers the viscosity of the glass, which may enhance the formability and manufacturability of the glass. The inclusion of MgO in the glass composition also improves the strain point and the Young's modulus of the glass composition and may also improve the ion exchange ability of the glass. However, when too much MgO is added to the glass composition, the density and the CTE of the glass composition increase undesirably. MgO included in the glass compositions also may contribute to the high fracture toughness values described herein. In embodiments, the glass composition comprises MgO in an amount of from greater than or equal to 0 mol % to less than or equal to 7 mol %, such as greater than 0 mol % to less than or equal to 7 mol %, greater than or equal to 0.5 mol % to less than or equal to 6.5 mol %, greater than or equal to 1 mol % to less than or equal to 6 mol %, greater than or equal to 1.5 mol % to less than or equal to 5.5 mol %, greater than or equal to 2 mol % to less than or equal to 5 mol %, greater than or equal to 2.5 mol % to less than or equal to 4.5 mol %, greater than or equal to 3 mol % to less than or equal to mol %, greater than or equal to 3.5 mol % to less than or equal to 7 mol %, and all ranges and sub-ranges between the foregoing values. In embodiments, the glass composition may be substantially free or free of MgO. As used herein, the term "substantially free" means that the component is not added as a component of the batch material even though the component may be present in the final glass in very small amounts as a contaminant, such as less than 0.01 mol %.

The glass compositions may include CaO. The inclusion of CaO lowers the viscosity of the glass, which enhances the formability, the strain point and the Young's modulus, and may improve the ion exchange ability. However, when too much CaO is added to the glass composition, the density and the CTE of the glass composition increase. In embodiments, the glass composition comprises CaO in an amount of from greater than or equal to 0 mol % to less than or equal to 5 mol %, such as greater than 0 mol % to less than or equal to 5 mol %, greater than or equal to 0.5 mol % to less than or equal to 4.5 mol %, greater than or equal to 1 mol % to less than or equal to 4 mol %, greater than or equal to 1.5 mol % to less than or equal to 3.5 mol %, greater than or equal to 2 mol % to less than or equal to 3 mol %, greater than or equal to 2.5 mol % to less than or equal to 5 mol %, and all ranges and sub-ranges between the foregoing values. In embodiments, the glass composition may be substantially free or free of CaO.

The glass compositions may include $Y_2O_3$. The inclusion of $Y_2O_3$ in the glass compositions contributes to the high fracture toughness values described herein. The $Y_2O_3$ also increases the solubility of $ZrO_2$ in the glass, enabling higher amounts of $ZrO_2$ to be incorporated without the development of undesirable inclusions. Due to the limited availability of $Y_2O_3$ raw materials, the amount of $Y_2O_3$ in the glass is limited to enhance the mechanical performance of the glass while avoiding difficulties in sourcing raw materials for production. In embodiments, the glass composition comprises $Y_2O_3$ in an amount from greater than or equal to 0 mol % to less than or equal to 5 mol %, such as greater than 0 mol % to less than or equal to 5 mol %, greater than or equal to 0.5 mol % to less than or equal to 4.5 mol %, greater than or equal to 1 mol % to less than or equal to 4 mol %, greater than or equal to 1.5 mol % to less than or equal to 3.5 mol %, greater than or equal to 2 mol % to less than or equal to 3 mol %, greater than or equal to 2.5 mol % to less than or equal to 5 mol %, and all ranges and sub-ranges between the foregoing values. In embodiments, the glass composition may be substantially free or free of $Y_2O_3$.

The glass compositions may include $ZrO_2$. The inclusion of $ZrO_2$ in the glass compositions contributes to the high fracture toughness values described herein, increasing the fracture toughness drastically. If the amount of $ZrO_2$ in the glass is too high undesirable zirconia inclusions may be formed in the glass. In embodiments, the glass composition comprises $ZrO_2$ in an amount from greater than or equal to 0 mol % to less than or equal to 0.8 mol %, such as greater than 0 mol % to less than or equal to 0.8 mol %, greater than or equal to 0.1 mol % to less than or equal to 0.7 mol %, greater than or equal to 0.2 mol % to less than or equal to 0.6 mol %, greater than or equal to 0.3 mol % to less than or equal to 0.5 mol %, greater than or equal to 0.4 mol % to less than or equal to 0.8 mol %, and all ranges and sub-ranges between the foregoing values. In embodiments, the glass composition may be substantially free or free of $ZrO_2$.

The glass compositions are characterized by the total amount of the $Y_2O_3$ and $ZrO_2$ components contained therein. As described above, $Y_2O_3$ and $ZrO_2$ each individually increase the fracture toughness of the glass compositions. For this reason, the glass compositions include at least one of $Y_2O_3$ and $ZrO_2$. In embodiments, $Y_2O_3+ZrO_2$ is greater than or equal to 0.2 mol %, such as greater than or equal to 0.3 mol %, greater than or equal to 0.4 mol %, greater than or equal to 0.5 mol %, greater than or equal to 0.6 mol %, greater than or equal to 0.7 mol %, greater than or equal to 0.8 mol %, greater than or equal to 0.9 mol %, greater than or equal to 1.0 mol %, greater than or equal to 1.5 mol %, greater than or equal to 2.0 mol %, greater than or equal to 2.5 mol %, greater than or equal to 3.0 mol %, greater than or equal to 3.5 mol %, greater than or equal to 4.0 mol %, greater than or equal to 4.5 mol %, or more. In embodiments, $Y_2O_3+ZrO_2$ is greater than or equal to 0.2 mol % to less than or equal to 5 mol %, such as greater than or equal to 0.2 mol % to less than or equal to 5.0 mol %, greater than or equal to 0.3 mol % to less than or equal to 4.9 mol %, greater than or equal to 0.4 mol % to less than or equal to 4.8 mol %, greater than or equal to 0.5 mol % to less than or equal to 4.7 mol %, greater than or equal to 0.6 mol % to less than or equal to 4.6 mol %, greater than or equal to 0.7 mol % to less than or equal to 4.5 mol %, greater than or equal to 0.8 mol % to less than or equal to 4.4 mol %, greater than or equal to 0.9 mol % to less than or equal to 4.3 mol %, greater than or equal to 1.0 mol % to less than or equal to 4.2 mol %, greater than or equal to 1.1 mol % to less than or equal to 4.1 mol %, greater than or equal to 1.2 mol % to less than or equal to 4.0 mol %, greater than or equal to 1.3 mol % to less than or equal to 3.9 mol %, greater than or equal to 1.4 mol % to less than or equal to 3.8 mol %, greater than or equal to 1.5 mol % to less than or equal to 3.7 mol %, greater than or equal to 1.6 mol % to less than or equal to 3.6 mol %, greater than or equal to 1.7 mol % to less than or equal to 3.5 mol %, greater than or equal to 1.8 mol % to less than or equal to 3.4 mol %, greater than or equal to 1.9 mol % to less than or equal to 3.3 mol %, greater than or equal to 2.0 mol % to less than or equal to 3.2 mol %, greater than or equal to 2.1 mol % to less than or equal to 3.1 mol %, greater than or equal to 2.2 mol % to less than or equal to 3.0 mol %, greater than or equal to 2.3 mol % to less than or equal to 2.9 mol %, greater than or equal to 2.4 mol % to less than or equal to 2.8 mol %, greater than or equal to 2.5 mol % to less than or equal to 2.7 mol %, greater than or equal to 2.6 mol % to less than or equal to 5.0 mol %, and all ranges and sub-ranges between the foregoing values.

The glass compositions are characterized by the amount of excess $Al_2O_3$. Excess $Al_2O_3$ increases the fracture toughness of the glass. The amount of excess $Al_2O_3$ may be calculated as $R_2O+R'O-Al_2O_3$, where $R_2O$ is the total amount of alkali oxides and R'O is the total amount of alkaline earth oxides. Even in cases where the glass does not include excess $Al_2O_3$, the value of $R_2O+R'O-Al_2O_3$ is maintained near zero to ensure that the glass composition is close to charge balanced. In embodiments, $R_2O+R'O-Al_2O_3$ is less than or equal to 3 mol %, such as less than or equal to 2.5 mol %, less than or equal to 2 mol %, less than or equal to 1.5 mol %, less than or equal to 1 mol %, less than or equal to 0.5 mol %, less than or equal to 0 mol %, less than or equal to −0.5 mol %, less than or equal to −1 mol %, less than or equal to −1.5 mol %, or less. In embodiments, $R_2O+R'O-Al_2O_3$ is from greater than or equal to −2 mol % to less than or equal to 3 mol %, such as greater than or equal to −2 mol % to less than or equal to 2 mol %, greater than or equal to −1.5 mol % to less than or equal to 2.5 mol %, greater than or equal to −1 mol % to less than or equal to 2 mol %, greater than or equal to −0.5 mol % to less than or equal to 1.5 mol %, greater than or equal to 0 mol % to less than or equal to 1 mol %, greater than or equal to 0 mol % to less than or equal to 0.5 mol %, and all ranges and sub-ranges between the foregoing values.

The glass compositions may also be characterized by the total amount of CaO and MgO included therein. As described above, including CaO and MgO may improve the ion exchangeability of the glass composition as well as increasing the fracture toughness. In embodiments, CaO+MgO is greater than or equal to 0 mol % to less than or equal to 6 mol %, such as greater than or equal to 1 mol % to less than or equal to 6 mol %, greater than 0 mol % to less than or equal to 6 mol %, greater than or equal to 0.5 mol % to less than or equal to 5.5 mol %, greater than or equal to 1 mol % to less than or equal to 5 mol %, greater than or equal to 1.5 mol % to less than or equal to 4.5 mol %, greater than or equal to 2 mol % to less than or equal to 4 mol %, greater than or equal to 2.5 mol % to less than or equal to 3.5 mol %, greater than or equal to 3 mol % to less than or equal to 6 mol %, and all ranges and sub-ranges between the foregoing values.

The glass compositions may optionally include one or more fining agents. In embodiments, the fining agent may include, for example, $SnO_2$. In such embodiments, $SnO_2$ may be present in the glass composition in an amount less than or equal to 0.2 mol %, such as less than or equal to 0.1 mol %, greater than or equal to 0 mol % to less than or equal to 0.2 mol %, greater than or equal to 0 mol % to less than or equal to 0.1 mol %, greater than or equal to 0 mol % to less than or equal to 0.05 mol %, greater than or equal to 0.1 mol % to less than or equal to 0.2 mol %, and all ranges and sub-ranges between the foregoing values. In some embodiments, the glass composition may be substantially free or free of $SnO_2$. In embodiments, the glass composition may be substantially free of one or both of arsenic and antimony. In other embodiments, the glass composition may be free of one or both of arsenic and antimony.

In embodiments, the glass composition may be substantially free or free of $TiO_2$. The inclusion of $TiO_2$ in the glass composition may result in the glass being susceptible to devitrification and/or exhibiting an undesirable coloration.

In embodiments, the glass composition may be substantially free or free of $P_2O_5$. The inclusion of $P_2O_5$ in the glass composition may undesirably reduce the meltability and formability of the glass composition, thereby impairing the manufacturability of the glass composition. It is not necessary to include $P_2O_5$ in the glass compositions described herein to achieve the desired ion exchange performance. For this reason, $P_2O_5$ may be excluded from the glass composition to avoid negatively impacting the manufacturability of the glass composition while maintaining the desired ion exchange performance In embodiments, the glass composition may be substantially free or free of $Fe_2O_3$. Iron is often present in raw materials utilized to form glass compositions, and as a result may be detectable in the glass compositions described herein even when not actively added to the glass batch.

Physical properties of the glass compositions as disclosed above will now be discussed.

Glass compositions according to embodiments have a high fracture toughness. Without wishing to be bound by any particular theory, the high fracture toughness may impart improved drop performance to the glass compositions. As utilized herein, the fracture toughness refers to the $K_{IC}$ value, and is measured by the chevron notched short bar method. The chevron notched short bar (CNSB) method utilized to measure the $K_{IC}$ value is disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992). Additionally, the $K_{IC}$ values are measured on non-strengthened glass samples, such as measuring the $K_{IC}$ value prior to ion exchanging a glass article. The $K_{IC}$ values discussed herein are reported in MPa√m, unless otherwise noted.

In embodiments, the glass compositions exhibit a $K_{IC}$ value of greater than or equal to 0.75 MPa√m, such as greater than or equal to 0.76 MPa√m, greater than or equal to 0.77 MPa√m, greater than or equal to 0.78 MPa√m, greater than or equal to 0.79 MPa√m, greater than or equal to 0.80 MPa√m, greater than or equal to 0.8 MPa√m, greater than or equal to 0.81 MPa√m, greater than or equal to 0.82 MPa√m, greater than or equal to 0.83 MPa√m, greater than or equal to 0.84 MPa√m, greater than or equal to 0.85 MPa√m, greater than or equal to 0.86 MPa√m, greater than or equal to 0.87 MPa√m, greater than or equal to 0.88 MPa√m, greater than or equal to 0.89 MPa√m, greater than or equal to 0.90 MPa√m, greater than or equal to 0.9 MPa√m, greater than or equal to 0.91 MPa√m, greater than or equal to 0.92 MPa√m, or more. In embodiments, the glass compositions exhibit a $K_{IC}$ value of from greater than or equal to 0.75 MPa√m to less than or equal to 0.95 MPa√m, such as greater than or equal to 0.76 MPa√m to less than or equal to 0.94 MPa√m, greater than or equal to 0.77 to less than or equal to 0.93 MPa√m, greater than or equal to 0.78 MPa√m to less than or equal to 0.92 MPa√m, greater than or equal to 0.79 MPa√m to less than or equal to 0.91 MPa√m, greater than or equal to 0.80 MPa√m to less than or equal to 0.90 MPa√m, greater than or equal to 0.8 MPa√m to less than or equal to 0.9 MPa√m, greater than or equal to 0.81 MPa√m to less than or equal to 0.89 MPa√m, greater than or equal to 0.82 MPa√m to less than or equal to 0.88 MPa√m, greater than or equal to 0.83 MPa√m to less than or equal to 0.87 MPa√m, greater than or equal to 0.84 MPa√m to less than or equal to 0.86 MPa√m, greater than or equal to 0.85 MPa√m to less than or equal to 0.95 MPa√m, and all ranges and sub-ranges between the foregoing values. The high fracture toughness of the glass compositions described herein increases the resistance of the glasses to damage.

In embodiments, the Young's modulus (E) of the glass compositions is greater than or equal to 75 GPa, such as greater than or equal to 80 GPa, greater than or equal to 85 GPa, greater than or equal to 90 GPa, or more. In embodiments, the Young's modulus (E) of the glass compositions may be from greater than or equal to 75 GPa to less than or equal to 95 GPa, such as greater than or equal to 79 GPa to less than or equal to 92 GPa, greater than or equal to 80 GPa to less than or equal to 90 GPa, from greater than or equal to 85 GPa to less than or equal to 90 GPa, and all ranges and sub-ranges between the foregoing values. The Young's modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

In embodiments, the glass compositions have a shear modulus (G) of greater than or equal to 30 GPa, such as greater than or equal to 31 GPa, greater than or equal to 32 GPa, greater than or equal to 33 GPa, greater than or equal to 34 GPa, greater than or equal to 35 GPa, greater than or equal to 36 GPa, or more. In embodiments, the glass composition may have a shear modulus (G) of from greater than or equal to 30 GPa to less than or equal to 40 GPa, such as greater than or equal to 32 GPa to less than or equal to 37 GPa, greater than or equal to 31 GPa to less than or equal to 39 GPa, greater than or equal to 32 GPa to less than or equal to 38 GPa, greater than or equal to 33 GPa to less than or equal to 37 GPa, greater than or equal to 34 GPa to less than or equal to 36 GPa, greater than or equal to 33 GPa to less than or equal to 35 GPa, and all ranges and sub-ranges between the foregoing values. The shear modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

In embodiments, the glass compositions have a Poisson's ratio (v) of greater than or equal to 0.220, such as greater than or equal to 0.221, greater than or equal to 0.222, greater than or equal to 0.223, greater than or equal to 0.224, greater than or equal to 0.225, greater than or equal to 0.226, greater than or equal to 0.227, greater than or equal to 0.228, greater than or equal to 0.229, greater than or equal to 0.230, or more. In embodiments, the glass compositions may have a Poisson's ratio (v) of from greater than or equal to 0.220 to less than or equal to 0.230, such as greater than or equal to 0.221 to less than or equal to 0.229, greater than or equal to 0.222 to less than or equal to 0.228, greater than or equal to 0.223 to less than or equal to 0.227, greater than or equal to 0.224 to less than or equal to 0.226, greater than or equal to 0.223 to less than or equal to 0.225, and all ranges and sub-ranges between the foregoing values. The Poisson's ratio value recited in this disclosure refers to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

From the above compositions, glass articles according to embodiments may be formed by any suitable method. In embodiments, the glass compositions may be formed by rolling processes.

The glass composition and the articles produced therefrom may be characterized by the manner in which it may be formed. For instance, the glass composition may be characterized as float-formable (i.e., formed by a float process) or roll-formable (i.e., formed by a rolling process).

In one or more embodiments, the glass compositions described herein may form glass articles that exhibit an amorphous microstructure and may be substantially free of crystals or crystallites. In other words, the glass articles formed from the glass compositions described herein may exclude glass-ceramic materials.

As mentioned above, in embodiments, the glass compositions described herein can be strengthened, such as by ion exchange, making a glass article that is damage resistant for applications such as, but not limited to, display covers. With reference to FIG. 1, a glass article is depicted that has a first region under compressive stress (e.g., first and second compressive layers 120, 122 in FIG. 1) extending from the surface to a depth of compression (DOC) of the glass article and a second region (e.g., central region 130 in FIG. 1) under a tensile stress or central tension (CT) extending from the DOC into the central or interior region of the glass article. As used herein, DOC refers to the depth at which the stress within the glass article changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) has a maximum at or near the surface of the glass article, and the CS varies with distance d from the surface according to a function. Referring again to FIG. 1, a first segment 120 extends from first surface 110 to a depth $d_1$ and a second segment 122 extends from second surface 112 to a depth $d_2$. Together, these segments define a compression or CS of glass article 100. Compressive stress (including surface CS) may be measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

In embodiments, the compressive stress layer includes a CS of from greater than or equal to 400 MPa to less than or equal to 1200 MPa, such as from greater than or equal to 425 MPa to less than or equal to 1150 MPa, from greater than or equal to 450 MPa to less than or equal to 1100 MPa, from greater than or equal to 475 MPa to less than or equal to 1050 MPa, from greater than or equal to 500 MPa to less than or equal to 1000 MPa, from greater than or equal to 525 MPa to less than or equal to 975 MPa, from greater than or equal to 550 MPa to less than or equal to 950 MPa, from greater than or equal to 575 MPa to less than or equal to 925 MPa, from greater than or equal to 600 MPa to less than or equal to 900 MPa, from greater than or equal to 625 MPa to less than or equal to 875 MPa, from greater than or equal to 650 MPa to less than or equal to 850 MPa, from greater than or equal to 675 MPa to less than or equal to 825 MPa, from greater than or equal to 700 MPa to less than or equal to 800 MPa, from greater than or equal to 725 MPa to less than or equal to 775 MPa, greater than or equal to 750 MPa to less than or equal to 1200 MPa, greater than or equal to 550 MPa to less than or equal to 925 MPa, and all ranges and sub-ranges between the foregoing values. In embodiments, the compressive stress layer includes a CS of greater than or equal to 400 MPa, such as greater than or equal to 450 MPa, greater than or equal to 500 MPa, greater than or equal to 550 MPa, greater than or equal to 600 MPa, greater than or equal to 650 MPa, greater than or equal to 700 MPa, greater than or equal to 750 MPa, greater than or equal to 800 MPa, greater than or equal to 850 MPa, greater than or equal to 900 MPa, or more.

In one or more embodiments, $Na^+$ and $K^+$ ions are exchanged into the glass article and the $Na^+$ ions diffuse to a deeper depth into the glass article than the $K^+$ ions. The depth of penetration of $K^+$ ions ("$DOL_K$") is distinguished from DOC because it represents the depth of potassium penetration as a result of an ion exchange process. The Potassium DOL is typically less than the DOC for the articles described herein. Potassium DOL is measured using a surface stress meter such as the commercially available FSM-6000 surface stress meter, manufactured by Orihara Industrial Co., Ltd. (Japan), which relies on accurate measurement of the stress optical coefficient (SOC), as described above with reference to the CS measurement. The potassium DOL ($DOL_K$) may define a depth of a compressive stress spike ($DOL_{SP}$), where a stress profile transitions from a steep spike region to a less-steep deep region. The deep region extends from the bottom of the spike to the depth of compression. In embodiments, the $DOL_K$ of the glass articles may be from greater than or equal to 4 μm to less than or equal to 11 μm, such as greater than or equal to 5 μm to less than or equal to 10 μm, greater than or equal to 6 μm to less than or equal to 9 μm, greater than or equal to 7 μm to less than or equal to 8 μm, and all ranges and sub-ranges between the foregoing values. In embodiments, the $DOL_K$ of the glass articles may be greater than or equal to 4 μm, such as greater than or equal to 5 μm, greater than or equal to 6 μm, greater than or equal to 7 μm, greater than or equal to 8 μm, greater than or equal to 9 μm, greater than or equal to 10 μm, or more. In embodiments, the $DOL_K$ of the glass articles may be less than or equal to 11 μm, such as less than or equal to 10 μm, less than or equal to 9 μm, less than or equal to 8 μm, less than or equal to 7 μm, less than or equal to 6 μm, less than or equal to 5 μm, or less.

The compressive stress of both major surfaces (110, 112 in FIG. 1) is balanced by stored tension in the central region (130) of the glass article. The maximum central tension (CT) and DOC values may be measured using a scattered light polariscope (SCALP) technique known in the art. The refracted near-field (RNF) method or SCALP may be used to determine the stress profile of the glass articles. When the RNF method is utilized to measure the stress profile, the maximum CT value provided by SCALP is utilized in the RNF method. In particular, the stress profile determined by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

The amount of the maximum central tension in the glass articles indicates the degree of strengthening that has occurred through the ion exchange process, with higher maximum CT values correlating to an increased degree of strengthening. If the maximum CT value is too high, the glass articles may exhibit undesirable frangible behavior. In embodiments, the glass articles may have a maximum CT greater than or equal to 90 MPa, such as greater than or equal to 95 MPa, greater than or equal to 100 MPa, greater than or equal to 105 MPa, greater than or equal to 110 MPa, greater than or equal to 115 MPa, greater than or equal to 120 MPa, greater than or equal to 125 MPa, greater than or equal to 130 MPa, greater than or equal to 135 MPa, greater than or equal to 140 MPa, greater than or equal to 145 MPa, greater than or equal to 150 MPa, greater than or equal to 155 MPa, or more. In embodiments, the glass article may have a maximum CT of from greater than or equal to 90 MPa to less than or equal to 160 MPa, such as greater than or equal to 95 MPa to less than or equal to 155 MPa, greater than or equal to 100 MPa to less than or equal to 150 MPa, greater than or equal to 105 MPa to less than or equal to 145 MPa, greater than or equal to 110 MPa to less than or equal to 140 MPa, greater than or equal to 115 MPa to less than or equal to 135 MPa, greater than or equal to 120 MPa to less than or equal to 130 MPa, greater than or equal to 125 MPa to less than or equal to 160 MPa, greater than or equal to 100 MPa to less than or equal to 160 MPa, and all ranges and sub-ranges between the foregoing values.

The high fracture toughness values of the glass compositions described herein also may enable improved performance. The frangibility limit of the glass articles produced utilizing the glass compositions described herein is dependent at least in part on the fracture toughness. For this reason, the high fracture toughness of the glass compositions described herein allows for a large amount of stored strain energy to be imparted to the glass articles formed therefrom without becoming frangible. The increased amount of stored strain energy that may then be included in the glass articles allows the glass articles to exhibit increased fracture resistance, which may be observed through the drop performance of the glass articles. The relationship between the frangibility limit and the fracture toughness is described in U.S. Patent Application Pub. No. 2020/0079689 A1, titled "Glass-based Articles with Improved Fracture Resistance," published Mar. 12, 2020, the entirety of which is incorporated herein by reference. The relationship between the fracture toughness and drop performance is described in U.S. Patent Application Pub. No. 2019/0369672 A1, titled "Glass with Improved Drop Performance," published Dec. 5, 2019, the entirety of which is incorporated herein by reference.

As noted above, DOC is measured using a scattered light polariscope (SCALP) technique known in the art. The DOC is provided in some embodiments herein as a portion of the thickness (t) of the glass article. In embodiments, the glass articles may have a depth of compression (DOC) from greater than or equal to 0.15 t to less than or equal to 0.25 t, such as from greater than or equal to 0.18 t to less than or equal to 0.22 t, or from greater than or equal to 0.19 t to less than or equal to 0.21 t, and all ranges and sub-ranges between the foregoing values.

Compressive stress layers may be formed in the glass by exposing the glass to an ion exchange medium. In embodiments, the ion exchange medium may be molten nitrate salt.

In embodiments, the ion exchange medium may be a molten salt bath, and may include $KNO_3$, $NaNO_3$, or combinations thereof. In embodiments, the ion exchange medium may include $KNO_3$ in an amount of less than or equal to 95 wt %, such as less than or equal to 90 wt %, less than or equal to 85 wt %, less than or equal to 80 wt %, less than or equal to 75 wt %, or less. In embodiments, the ion exchange medium may include $KNO_3$ in an amount of greater than or equal to 75 wt %, such as greater than or equal to 80 wt %, greater than or equal to 85 wt %, greater than or equal to 90 wt %, greater than or equal to 95 wt %, or more. In embodiments, the ion exchange medium may include $KNO_3$ in an amount of greater than or equal to 75 wt % to less than or equal to 95 wt %, such as greater than or equal to 80 wt % to less than or equal to 90 wt %, greater than or equal to 75 wt % to less than or equal to 85 wt %, and all ranges and sub-ranges between the foregoing values. In embodiments, the ion exchange medium may include $NaNO_3$ in an amount of less than or equal to 25 wt %, such as less than or equal to 20 wt %, less than or equal to 15 wt %, less than or equal to 10 wt %, less than or equal to 5 wt %, or less. In embodiments, the ion exchange medium may include $NaNO_3$ in an amount of greater than or equal to 5 wt %, such as greater than or equal to 10 wt %, greater than or equal to 15 wt %, greater than or equal to 20 wt %, or more. In embodiments, the ion exchange medium may include $NaNO_3$ in an amount of greater than or equal to 5 wt % to less than or equal to 25 wt %, such as greater than or equal to 10 wt % to less than or equal to 20 wt %, greater than or equal to 15 wt % to less than or equal to 25 wt %, and all ranges and sub-ranges between the foregoing values. It should be understood that the ion exchange medium may be defined by any combination of the foregoing ranges. In embodiments, other sodium and potassium salts may be used in the ion exchange medium, such as, for example sodium or potassium nitrites, phosphates, or sulfates. In embodiments, the ion exchange medium may include lithium salts, such as $LiNO_3$. The ion exchange medium may additionally include additives commonly included when ion exchanging glass, such as silicic acid.

The glass composition may be exposed to the ion exchange medium by dipping a glass substrate made from the glass composition into a bath of the ion exchange medium, spraying the ion exchange medium onto a glass substrate made from the glass composition, or otherwise physically applying the ion exchange medium to a glass substrate made from the glass composition to form the ion exchanged glass article. Upon exposure to the glass composition, the ion exchange medium may, according to embodiments, be at a temperature from greater than or equal to 360° C. to less than or equal to 500° C., such as greater than or equal to 370° C. to less than or equal to 490° C., greater than or equal to 380° C. to less than or equal to 480° C., greater than or equal to 390° C. to less than or equal to 470° C., greater than or equal to 400° C. to less than or equal to 460° C., greater than or equal to 410° C. to less than or equal to 450° C., greater than or equal to 420° C. to less than or equal to 440° C., greater than or equal to 430° C. to less than or equal to 470° C., greater than or equal to 430° C. to less than or equal to 450° C., and all ranges and sub-ranges between the foregoing values. In embodiments, the glass composition may be exposed to the ion exchange medium for a duration from greater than or equal to 4 hours to less than or equal to 48 hours, such as greater than or equal to 4 hours to less than or equal to 24 hours, greater than or equal to 8 hours to less than or equal to 44 hours, greater than or equal to 12 hours to less than or equal to 40 hours, greater than or equal to 16 hours to less than or equal to 36 hours, greater than or equal to 20 hours to less than or equal to 32 hours, from greater than or equal to 24 hours to less than or equal to 28 hours, greater than or equal to 4 hours to less than or equal to 12 hours, and all ranges and sub-ranges between the foregoing values.

The ion exchange process may be performed in an ion exchange medium under processing conditions that provide an improved compressive stress profile as disclosed, for example, in U.S. Patent Application Publication No. 2016/0102011, which is incorporated herein by reference in its entirety. In some embodiments, the ion exchange process may be selected to form a parabolic stress profile in the glass articles, such as those stress profiles described in U.S. Patent Application Publication No. 2016/0102014, which is incorporated herein by reference in its entirety.

After an ion exchange process is performed, it should be understood that a composition at the surface of an ion exchanged glass article is be different than the composition of the as-formed glass substrate (i.e., the glass substrate before it undergoes an ion exchange process). This results from one type of alkali metal ion in the as-formed glass substrate, such as, for example $Li^+$ or $Na^+$, being replaced with larger alkali metal ions, such as, for example $Na^+$ or $K^+$, respectively. However, the glass composition at or near the center of the depth of the glass article will, in embodiments, still have the composition of the as-formed non-ion exchanged glass substrate utilized to form the glass article. As utilized herein, the center of the glass article refers to any location in the glass article that is a distance of at least 0.5 t from every surface thereof, where t is the thickness of the glass article.

Figure 2A:
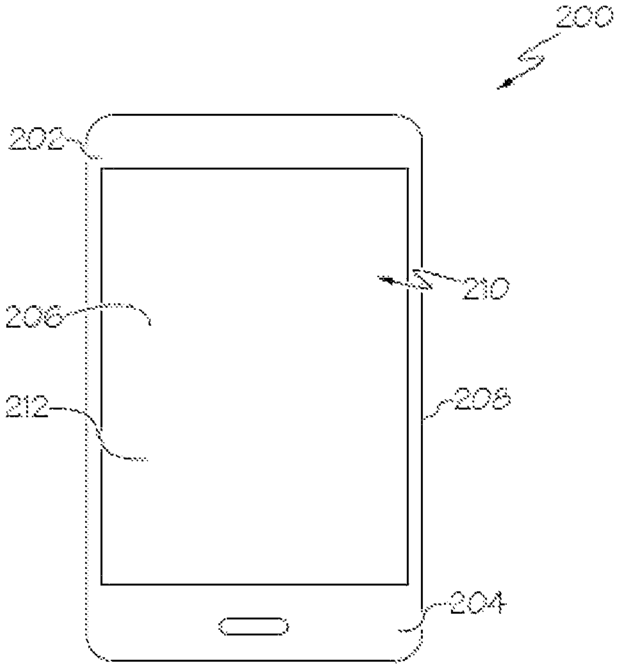
FIG. 2A is a plan view of an exemplary electronic device incorporating any of the glass articles disclosed herein.
Figure 2B:
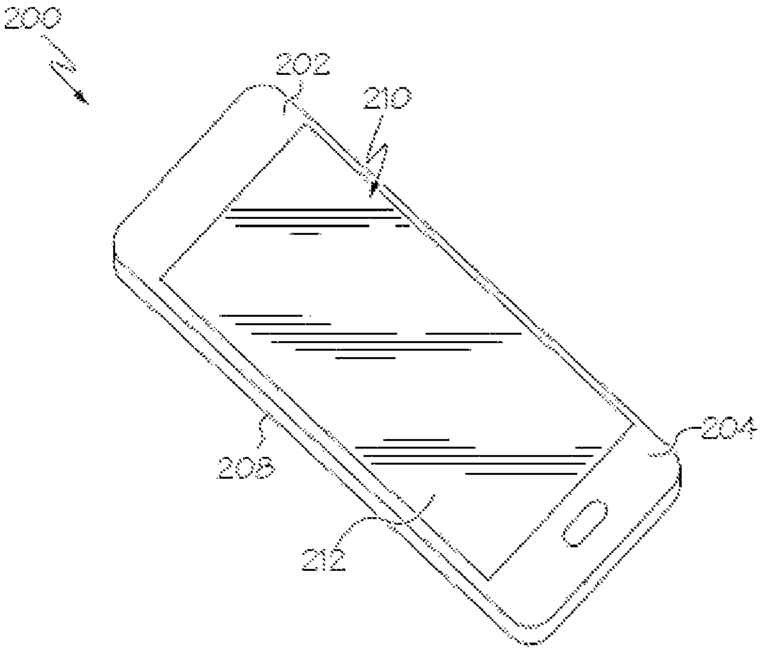
FIG. 2B is a perspective view of the exemplary electronic device of FIG. 2A.

The glass articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass articles disclosed herein is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover 212 at or over the front surface of the housing such that it is over the display. In embodiments, at least a portion of at least one of the cover 212 and the housing 202 may include any of the glass articles described herein.

EXAMPLES

Embodiments will be further clarified by the following examples. It should be understood that these examples are not limiting to the embodiments described above.

Glass compositions were prepared and analyzed. The analyzed glass compositions included the components listed in Table I below and were prepared by conventional glass forming methods. In Table I, all components are in mol %, and the $K_{IC}$ fracture toughness, the Poisson's ratio (ν), the Young's modulus (E), the shear modulus (G), and the stress optical coefficient (SOC) of the glass compositions were measured according to the methods disclosed herein.

The liquidus temperature of the glass was measured in accordance with ASTM C829-81 (2015), titled "Standard Practice for Measurement of Liquidus Temperature of Glass by the Gradient Furnace Method". The liquidus viscosity of the glass was determined by measuring the viscosity at the measured liquidus temperature in accordance with ASTM C965-96 (2012), titled "Standard Practice for Measuring Viscosity of Glass Above the Softening Point". The density was determined using the buoyancy method of ASTM C693-93(2013). The strain point and the annealing point were determined using the beam bending viscosity method of ASTM C598-93(2013). The softening point was determined using the parallel plate viscosity method of ASTM C1351M-96(2012).

TABLE I

| Composition | A | B | C | D | E | F | G |
|---|---|---|---|---|---|---|---|
| $SiO_2$ | 62.0 | 61.0 | 60.1 | 59.3 | 58.3 | 59.9 | 59.1 |
| $Al_2O_3$ | 16.1 | 16.0 | 16.0 | 15.9 | 15.9 | 16.0 | 15.8 |
| $B_2O_3$ | 5.1 | 5.2 | 5.2 | 5.1 | 5.1 | 5.3 | 5.2 |
| $Li_2O$ | 8.4 | 8.4 | 8.5 | 8.4 | 8.5 | 9.4 | 9.5 |
| $Na_2O$ | 4.4 | 4.4 | 4.4 | 4.4 | 4.3 | 5.4 | 5.4 |
| MgO | 2.9 | 2.9 | 2.9 | 2.9 | 2.9 | 2.9 | 2.9 |
| CaO | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 |
| $Y_2O_3$ | 1.0 | 2.0 | 3.0 | 3.9 | 4.9 | 1.0 | 1.9 |
| $ZrO_2$ | 0.0 | 0.0 | 0.0 | 0.0 | 0.0 | 0.0 | 0.0 |
| $SnO_2$ | 0.04 | 0.05 | 0.05 | 0.04 | 0.04 | 0.05 | 0.05 |
| MgO + CaO | 2.9 | 2.9 | 2.9 | 2.9 | 2.9 | 2.9 | 2.9 |
| $R_2O$ | 12.8 | 12.8 | 12.9 | 12.8 | 12.8 | 14.8 | 14.9 |
| R'O | 2.9 | 2.9 | 2.9 | 2.9 | 2.9 | 2.9 | 2.9 |
| $R_2O$ + R'O−$Al_2O_3$ | −0.4 | −0.3 | −0.2 | −0.2 | −0.2 | 1.7 | 2.0 |
| $Y_2O_3$ + $ZrO_2$ | 1.0 | 2.0 | 3.0 | 3.9 | 4.9 | 1.0 | 1.9 |
| Composition | A | B | C | D | E | F | G |
| Density (g/cm$^3$) | 2.450 | 2.509 | 2.569 | 2.624 | 2.684 | 2.459 | 2.516 |
| Liquidus Temperature (° C.) | 1140 | 1185 | 1215 | 1230 | 1250 | 1125 | 1155 |
| Liquidus Phase | Spoclumene | Keivyite | Keivyite | Keivyite | Keivyite | Spodumene | Keivyite |
| Liquidus Viscosity (kP) | 14.4 | 4.4 | 1.9 | 1.0 | 0.6 | 8.6 | 3.6 |
| SOC (nm/mm/MPa) | 3.013 | 2.929 | 2.868 | 2.793 | 2.726 | 2.967 | 2.897 |
| Refractive Index | 1.5213 | 1.5301 | 1.5388 | 1.5474 | 1.5560 | 1.5233 | 1.5321 |
| $K_{IC}$ (MPa√) | 0.797 | 0.807 | 0.812 | | | | 0.782 |
| Poisson's Ratio | 0.228 | 0.230 | 0.232 | 0.235 | 0.240 | 0.227 | 0.229 |
| Young's Modulus (GPa) | 81.85 | 83.99 | 85.85 | 87.99 | 89.91 | 81.72 | 83.30 |
| Shear Modulus (GPa) | 33.35 | 34.17 | 34.86 | 35.62 | 36.24 | 33.28 | 33.90 |
| Softening Point (° C.) | 840.5 | 833.0 | 831.3 | 833.6 | 836.8 | 793.8 | 794.0 |
| Strain Point (° C.) | 574.3 | 587.0 | 588.9 | 593.4 | 605.0 | 541.2 | 554.3 |
| Anneal Point (° C.) | 621.9 | 632.2 | 633.8 | 638.7 | 648.7 | 586.7 | 598.8 |
| Composition | H | I | J | K | L | M | N |
| $SiO_2$ | 58.2 | 57.3 | 56.2 | 59.8 | 58.4 | 58.8 | 57.1 |
| $Al_2O_3$ | 15.9 | 15.9 | 15.9 | 18.1 | 18.4 | 17.6 | 18.0 |
| $B_2O_3$ | 5.2 | 5.0 | 5.2 | 5.2 | 5.1 | 5.0 | 5.1 |
| $Li_2O$ | 9.4 | 9.5 | 9.5 | 8.5 | 8.5 | 8.5 | 8.5 |
| $Na_2O$ | 5.4 | 5.4 | 5.4 | 4.4 | 4.4 | 4.4 | 4.4 |
| MgO | 2.9 | 2.9 | 2.9 | 2.9 | 3.0 | 2.8 | 2.9 |
| CaO | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 |
| $Y_2O_3$ | 3.0 | 3.9 | 4.9 | 1.0 | 2.0 | 2.9 | 3.9 |
| $ZrO_2$ | 0.0 | 0.0 | 0.0 | 0.0 | 0.0 | 0.0 | 0.0 |
| $SnO_2$ | 0.05 | 0.05 | 0.05 | 0.05 | 0.05 | 0.04 | 0.04 |
| MgO + CaO | 2.9 | 2.9 | 2.9 | 2.9 | 3.0 | 2.8 | 2.9 |
| $R_2O$ | 14.8 | 14.9 | 14.9 | 12.9 | 12.9 | 12.9 | 12.9 |
| R'O | 2.9 | 2.9 | 2.9 | 2.9 | 3.0 | 2.8 | 2.9 |
| $R_2O$ + R'O−$Al_2O_3$ | 1.8 | 1.9 | 1.9 | −2.3 | −2.5 | −1.9 | -2.2 |
| $Y_2O_3$ + $ZrO_2$ | 3.0 | 3.9 | 4.9 | 1.0 | 2.0 | 2.9 | 3.9 |
| Composition | H | I | J | K | L | M | N |
| Density (g/cm$^3$) | 2.574 | 2.632 | 2.689 | 2.465 | 2.524 | 2.578 | 2.636 |
| Liquiclus Temperature (° C.) | 1260 | 1220 | 1245 | 1255 | 1190 | 1130 | 1180 |
| Liquiclus Phase | Keivyite | Keivyite | Keivyite | Corundum | Corundum | P1-Keivyite P2-Corundum | Keivyite |
| Liquiclus Viscosity (kP) | 0.6 | 0.7 | 0.4 | 2.0 | 3.7 | 6.3 | 2.1 |
| SOC (nm/mm/MPa) | 2.832 | 2.820 | 2.681 | 2.958 | 2.890 | 2.817 | 2.755 |
| Refractive Index | 1.5405 | 1.5491 | 1.5575 | 1.5249 | 1.5332 | 1.5421 | 1.5504 |
| $K_{IC}$ (MPa√) | | 0.811 | | 0.843 | 0.821 | 0.911 | |
| Poisson's Ratio | 0.233 | 0.233 | 0.238 | 0.233 | 0.236 | 0.235 | 0.238 |
| Young's Modulus (GPa) | 85.57 | 87.57 | 89.50 | 83.30 | 85.30 | 87.23 | 89.36 |
| Shear Modulus (GPa) | 34.73 | 35.48 | 36.38 | 33.76 | 34.52 | 35.35 | 36.10 |
| Softening Point (° C.) | 798.6 | 803.3 | 808.4 | 843.1 | 846.4 | 837.2 | 836.3 |
| Strain Point (° C.) | 564.5 | 572.5 | 576.7 | 584.0 | 594.3 | 590.9 | 604.9 |
| Anneal Point (° C.) | 608.5 | 616.2 | 620.8 | 631.0 | 640.0 | 636.4 | 649.4 |

TABLE I-continued

| Composition | O | P | Q | R | S | T |
|---|---|---|---|---|---|---|
| $SiO_2$ | 56.4 | 56.7 | 56.7 | 56.0 | 55.8 | 50.7 |
| $Al_2O_3$ | 17.9 | 19.0 | 18.8 | 18.8 | 18.8 | 18.9 |
| $B_2O_3$ | 5.0 | 5.1 | 5.1 | 5.2 | 5.1 | 10.0 |
| $Li_2O$ | 8.5 | 11.0 | 10.9 | 11.0 | 10.9 | 11.1 |
| $Na_2O$ | 4.3 | 1.9 | 1.9 | 1.9 | 1.9 | 1.9 |
| MgO | 2.9 | 5.9 | 5.9 | 5.8 | 5.8 | 5.9 |
| CaO | 0.0 | 0.0 | 0.0 | 0.0 | 0.0 | 0.0 |
| $TiO_2$ | 0.0 | 0.0 | 0.0 | 0.0 | 0.0 | 0.0 |
| $Y_2O_3$ | 4.9 | 0.0 | 0.0 | 1.0 | 1.0 | 1.0 |
| $ZrO_2$ | 0.0 | 0.3 | 0.6 | 0.3 | 0.6 | 0.6 |
| $SnO_2$ | 0.04 | 0.00 | 0.00 | 0.00 | 0.00 | 0.00 |
| MgO + CaO | 2.9 | 5.9 | 5.9 | 5.8 | 5.8 | 5.9 |
| $R_2O$ | 12.8 | 12.9 | 12.8 | 12.9 | 12.8 | 13.0 |
| R'O | 2.9 | 5.9 | 5.9 | 5.8 | 5.8 | 5.9 |
| $R_2O$ + R'O−$Al_2O_3$ | −2.2 | −0.2 | −0.1 | −0.1 | −0.2 | 0.0 |
| $Y_2O_3$ + $ZrO_2$ | 4.9 | 0.3 | 0.6 | 1.3 | 1.6 | 1.6 |

| Composition | O | P | Q | R | S | T |
|---|---|---|---|---|---|---|
| Density (g/cm$^3$) | 2.694 | 2.442 | 2.450 | 2.488 | 2.501 | 2.510 |
| Temperature (° C.) | 1220 | 1320 | 1330 | 1260 | 1255 | 1180 |
| Liquilus Phase | Keivyite | Corundum | Pl-Corundum P2-Spinel | Pl-Spinel P2-Corundum | Pl-Spinel P2-Corundum | Corundum |
| Liquilus Viscosity (kP) | 0.9 | 0.4 | 0.3 | 0.6 | 0.7 | 0.7 |
| SOC (nm/mm/MPa) | 2.697 | 2.870 | 2.893 | 2.818 | 2.821 | 2.903 |
| Refractive Index | 1.5587 | 1.5286 | 1.5302 | 1.5375 | 1.5395 | 1.5393 |
| $K_{IC}$ (MPa√) | | 0.861 | 0.897 | 0.891 | 0.903 | 0.912 |
| Poisson's Ratio | 0.243 | 0.232 | 0.236 | 0.235 | 0.237 | 0.242 |
| Young's Modulus (GPa) | 91.29 | 85.64 | 86.19 | 87.71 | 88.33 | 85.09 |
| Shear Modulus(GPa) | 36.72 | 34.73 | 34.86 | 35.55 | 35.69 | 34.24 |
| Softening Point (° C.) | 841.5 | 827.2 | 824.5 | 820.0 | 818.9 | 771.2 |
| Strain Point (° C.) | 610.4 | 580.8 | 583.9 | 582.6 | 580.7 | 546.9 |
| Anneal Point (° C.) | 654.8 | 624.8 | 627.4 | 625.9 | 624.3 | 588.7 |

| Composition | U | V | W | X | Y | Z | AA |
|---|---|---|---|---|---|---|---|
| $SiO_2$ | 59.7 | 57.6 | 56.0 | 57.1 | 55.9 | 53.7 | 58.6 |
| $Al_2O_3$ | 17.6 | 18.5 | 19.2 | 18.8 | 19.2 | 20.1 | 18.0 |
| $B_2O_3$ | 5.2 | 5.0 | 5.1 | 5.1 | 5.1 | 5.1 | 5.0 |
| $Li_2O$ | 9.7 | 10.0 | 9.8 | 10.1 | 9.8 | 10.1 | 9.9 |
| $Na_2O$ | 2.8 | 2.8 | 2.8 | 2.8 | 2.8 | 2.8 | 2.8 |
| MgO | 3.0 | 3.9 | 4.9 | 3.0 | 3.0 | 3.0 | 2.8 |
| CaO | 0.0 | 0.0 | 0.0 | 1.1 | 2.1 | 3.1 | 0.0 |
| $TiO_2$ | 0.0 | 0.0 | 0.0 | 0.0 | 0.0 | 0.0 | 0.0 |
| $Y_2O_3$ | 2.0 | 2.0 | 2.0 | 2.0 | 2.0 | 2.0 | 2.9 |
| $ZrO_2$ | 0.0 | 0.0 | 0.0 | 0.0 | 0.0 | 0.0 | 0.0 |
| $SnO_2$ | 0.05 | 0.05 | 0.06 | 0.05 | 0.06 | 0.05 | 0.05 |
| MgO + CaO | 3.0 | 3.9 | 4.9 | 4.1 | 5.1 | 6.1 | 2.8 |
| $R_2O$ | 12.5 | 12.8 | 12.6 | 12.9 | 12.6 | 12.9 | 12.7 |
| R'O | 3.0 | 3.9 | 4.9 | 4.1 | 5.1 | 6.1 | 2.8 |
| $R_2O$ + R'O−$Al_2O_3$ | −2.1 | −1.8 | −1.7 | −1.8 | −1.5 | −1.1 | -2.5 |
| $Y_2O_3$ + $ZrO_2$ | 2.0 | 2.0 | 2.0 | 2.0 | 2.0 | 2.0 | 2.9 |

| Composition | U | V | W | X | Y | Z | AA |
|---|---|---|---|---|---|---|---|
| Density (g/cm$^3$) | 2.517 | 2.532 | 2.543 | 2.537 | 2.550 | 2.568 | 2.582 |
| Liquidus Temperature (° C.) | 1180 | 1250 | 1235 | 1230 | 1215 | 1260 | 1235 |
| Liquidus Phase | Spodumene | Corundum | Corundum | Corundum | Corundum | Corundum | Corundum |
| Liquidus Viscosity (kP) | 3.6 | 1.0 | 1.0 | 1.4 | 1.4 | 0.6 | 1.1 |
| SOC (nm/mm/MPa) | 2.885 | 2.826 | 2.799 | 2.800 | 2.755 | 2.715 | 2.797 |
| Refractive Index | 1.5344 | 1.5389 | 1.5414 | 1.5389 | 1.5434 | 1.5473 | 1.5448 |
| $K_{IC}$ (MPa√) | | 0.867 | 0.769 | | | | 0.874 |
| Poisson's Ratio | 0.235 | 0.237 | 0.242 | 0.238 | 0.239 | 0.243 | 0.242 |
| Young's Modulus (GPa) | 85.85 | 87.30 | 88.88 | 87.71 | 88.54 | 89.85 | 89.16 |
| Shear Modulus(GPa) | 34.79 | 35.28 | 35.76 | 35.41 | 35.76 | 36.10 | 35.90 |
| Softening Point (° C.) | 840.2 | 834.2 | 827.1 | 832.0 | 822.9 | 819.6 | 833.5 |
| Strain Point (° C.) | 593.8 | 590.3 | 591.0 | 589.5 | 589.5 | 587.3 | 600.6 |
| Anneal Point (° C.) | 639.1 | 634.4 | 634.4 | 634.0 | 633.5 | 630.0 | 645.5 |

| Composition | BB | CC | DD | EE | FF | GG | HH |
|---|---|---|---|---|---|---|---|
| $SiO_2$ | 57.0 | 54.5 | 57.0 | 55.3 | 53.7 | 62.3 | 62.0 |
| $Al_2O_3$ | 18.6 | 19.9 | 18.8 | 19.4 | 20.1 | 16.0 | 16.1 |
| $B_2O_3$ | 5.0 | 4.9 | 4.9 | 4.9 | 4.8 | 5.0 | 5.0 |
| $Li_2O$ | 9.8 | 9.9 | 9.7 | 9.8 | 9.8 | 7.9 | 8.0 |
| $Na_2O$ | 2.8 | 2.8 | 2.9 | 2.8 | 2.8 | 4.8 | 4.8 |
| MgO | 3.8 | 4.9 | 2.8 | 2.8 | 2.8 | 2.9 | 2.0 |
| CaO | 0.0 | 0.0 | 1.0 | 2.0 | 3.0 | 0.0 | 1.0 |

TABLE I-continued

| | | | | | | | |
|---|---|---|---|---|---|---|---|
| $TiO_2$ | 0.0 | 0.0 | 0.0 | 0.0 | 0.0 | 0.0 | 0.0 |
| $Y_2O_3$ | 2.9 | 3.0 | 2.9 | 2.9 | 2.9 | 1.0 | 1.0 |
| $ZrO_2$ | 0.0 | 0.0 | 0.0 | 0.0 | 0.0 | 0.0 | 0.0 |
| $SnO_2$ | 0.05 | 0.05 | 0.05 | 0.05 | 0.05 | 0.05 | 0.05 |
| MgO + CaO | 3.8 | 4.9 | 3.8 | 4.8 | 5.8 | 2.9 | 3.0 |
| $R_2O$ | 12.6 | 12.7 | 12.6 | 12.6 | 12.6 | 12.7 | 12.8 |
| R'O | 3.8 | 4.9 | 3.8 | 4.8 | 5.8 | 2.9 | 3.0 |
| $R_2O$ + R'O−$Al_2O_3$ | −2.2 | −2.3 | −2.4 | −2.0 | −1.7 | −0.4 | −0.3 |
| $Y_2O_3$ + $ZrO_2$ | 2.9 | 3.0 | 2.9 | 2.9 | 2.9 | 1.0 | 1.0 |

| Composition | BB | CC | DD | EE | FF | GG | HH |
|---|---|---|---|---|---|---|---|
| Density (g/cm$^3$) | | 2.610 | 2.601 | 2.614 | 2.627 | 2.453 | 2.456 |
| Liquidus Temperature (° C.) | 1225 | ~1290 | 1260 | 1260 | 1270 | 1130 | 1130 |
| Liquidus Phase | Corundum | Corundum | Corundum | Corundum | Corundum | Spodumene | Spodumene |
| Liquidus Viscosity (kP) | 0.9 | | 0.6 | 0.5 | 0.3 | 18.9 | 21.4 |
| SOC (nm/mm/MPa) | 2.767 | 2.708 | 2.733 | 2.685 | 2.658 | 3.005 | 2.992 |
| Refractive Index | 1.5479 | 1.5515 | 1.5495 | 1.5525 | 1.5562 | 1.5209 | 1.5217 |
| $K_{IC}$ (MPa√) | | | | | | 0.758 | 0.807 |
| Poisson's Ratio | 0.242 | 0.245 | 0.242 | 0.241 | 0.246 | 0.229 | 0.226 |
| Young's Modulus (GPa) | 89.91 | 91.71 | 90.26 | 91.50 | 92.05 | 81.58 | 81.37 |
| Shear Modulus(GPa) | 36.17 | 36.79 | 36.38 | 36.86 | 36.93 | 33.21 | 33.21 |
| Softening Point (° C.) | 828.6 | 823.3 | 827.7 | 819.5 | 813.1 | 838.2 | 836.1 |
| Strain Point (° C.) | 597.0 | 597.6 | 596.9 | 593.4 | 593.3 | 574.8 | 571.8 |
| Anneal Point (° C.) | 641.3 | 640.8 | 640.6 | 636.3 | 635.3 | 621.7 | 619.6 |

| Composition | II | JJ | KK | LL | MM | NN |
|---|---|---|---|---|---|---|
| $SiO_2$ | 62.0 | 60.2 | 60.1 | 60.2 | 58.2 | 58.2 |
| $Al_2O_3$ | 16.2 | 17.1 | 17.1 | 17.0 | 18.1 | 18.1 |
| $B_2O_3$ | 5.0 | 5.0 | 5.0 | 5.0 | 5.0 | 5.0 |
| $Li_2O$ | 8.0 | 7.9 | 7.9 | 8.0 | 8.9 | 8.9 |
| $Na_2O$ | 4.8 | 5.8 | 5.8 | 5.8 | 5.8 | 5.8 |
| MgO | 1.0 | 3.0 | 2.0 | 1.0 | 3.0 | 2.0 |
| CaO | 2.0 | 0.0 | 1.0 | 2.0 | 0.0 | 1.0 |
| $TiO_2$ | 0.0 | 0.0 | 0.0 | 0.0 | 0.0 | 0.0 |
| $Y_2O_3$ | 1.0 | 1.0 | 1.0 | 1.0 | 1.0 | 1.0 |
| $ZrO_2$ | 0.0 | 0.0 | 0.0 | 0.0 | 0.0 | 0.0 |
| $SnO_2$ | 0.05 | 0.05 | 0.05 | 0.05 | 0.05 | 0.05 |
| MgO + CaO | 3.0 | 3.0 | 3.0 | 3.0 | 3.0 | 3.0 |
| $R_2O$ | 12.8 | 13.7 | 13.7 | 13.8 | 14.7 | 14.7 |
| R'O | 3.0 | 3.0 | 3.0 | 3.0 | 3.0 | 3.0 |
| $R_2O$ + R'O−$Al_2O_3$ | −0.4 | −0.4 | −0.4 | −0.2 | −0.4 | −0.4 |
| $Y_2O_3$ + $ZrO_2$ | 1.0 | 1.0 | 1.0 | 1.0 | 1.0 | 1.0 |

| Composition | II | JJ | KK | LL | MM | NN |
|---|---|---|---|---|---|---|
| Density (g/cm$^3$) | 2.455 | 2.463 | 2.468 | 2.469 | 2.471 | 2.475 |
| Liquidus Temperature (° C.) | 1125 | 1110 | 1100 | 1095 | 1150 | 1120 |
| Liquidus Phase | Spodumene | Spinel | Spodumene | Spodumene | Corundum | Spodumene |
| Liquidus Viscosity (kP) | 23.2 | 21.8 | 29.1 | 28.1 | 6.7 | 11.5 |
| SOC (nm/mm/MPa) | 3.011 | 2.981 | 2.954 | 2.971 | 2.950 | 2.939 |
| Refractive Index | 1.5225 | 1.5227 | 1.5236 | 1.5241 | 1.5257 | 1.5262 |
| $K_{IC}$ (MPa√) | 0.816 | 0.775 | 0.787 | 0.788 | 0.804 | 0.822 |
| Poisson's Ratio | 0.226 | 0.229 | 0.230 | 0.230 | 0.231 | 0.228 |
| Young's Modulus (GPa) | 81.16 | 81.85 | 82.06 | 81.37 | 82.40 | 82.13 |
| Shear Modulus(GPa) | 33.07 | 33.28 | 33.35 | 33.07 | 33.49 | 33.42 |
| Softening Point (° C.) | 837.7 | 834.1 | 832.0 | 832.5 | 822.3 | 821.3 |
| Strain Point (° C.) | 570.9 | 573.5 | 568.6 | 567.3 | 565.7 | 564.5 |
| Anneal Point (° C.) | 618.3 | 620.1 | 615.4 | 614.1 | 611.8 | 609.7 |

| Composition | OO | PP | QQ | RR | SS | TT | UU |
|---|---|---|---|---|---|---|---|
| $SiO_2$ | 58.1 | 56.3 | 56.3 | 56.1 | 61.4 | 61.3 | 61.3 |
| $Al_2O_3$ | 18.1 | 19.0 | 19.0 | 19.1 | 16.5 | 16.6 | 16.6 |
| $B_2O_3$ | 5.0 | 5.1 | 4.9 | 5.0 | 4.9 | 4.9 | 5.0 |
| $Li_2O$ | 9.0 | 8.9 | 8.9 | 9.0 | 8.8 | 8.9 | 8.8 |
| $Na_2O$ | 5.8 | 6.8 | 6.8 | 6.8 | 5.8 | 5.9 | 5.8 |
| MgO | 1.0 | 2.9 | 2.0 | 1.0 | 1.0 | 0.0 | 0.5 |
| CaO | 2.0 | 0.0 | 1.0 | 2.0 | 0.0 | 1.0 | 0.5 |
| $TiO_2$ | 0.0 | 0.0 | 0.0 | 0.0 | 0.0 | 0.0 | 0.0 |
| $Y_2O_3$ | 1.0 | 1.0 | 1.0 | 1.0 | 1.5 | 1.5 | 1.5 |
| $ZrO_2$ | 0.0 | 0.0 | 0.0 | 0.0 | 0.0 | 0.0 | 0.0 |
| $SnO_2$ | 0.05 | 0.05 | 0.05 | 0.05 | 0.05 | 0.05 | 0.05 |
| MgO + CaO | 3.0 | 2.9 | 3.0 | 3.0 | 1.0 | 1.0 | 1.0 |
| $R_2O$ | 14.8 | 15.7 | 15.7 | 15.8 | 14.6 | 14.8 | 14.6 |
| R'O | 3.0 | 2.9 | 3.0 | 3.0 | 1.0 | 1.0 | 1.0 |
| $R_2O$ + R'O−$Al_2O_3$ | −0.3 | −0.4 | −0.3 | −0.3 | −0.9 | −0.8 | −1.0 |
| $Y_2O_3$ + $ZrO_2$ | 1.0 | 1.0 | 1.0 | 1.0 | 1.5 | 1.5 | 1.5 |

TABLE I-continued

| Composition | OO | PP | QQ | RR | SS | TT | UU |
|---|---|---|---|---|---|---|---|
| Density (g/cm$^3$) | 2.476 | 2.480 | 2.483 | 2.488 | 2.473 | 2.477 | 2.476 |
| Liquidus Temperature (° C.) | 1110 | 1185 | 1165 | 1120 | 1125 | 1125 | 1120 |
| Liquidus Phase | Spodumene | Spinel | Corundum | Corundum | Keivyite | Keivyite | Keivyite |
| Liquidus Viscosity (kP) | 10.9 | 3.4 | 4.1 | 8.8 | 15.3 | 16.7 | 18.4 |
| SOC (nm/mm/MPa) | 2.909 | 2.909 | 2.890 | 2.877 | 3.010 | 3.004 | 3.001 |
| Refractive Index | 1.5272 | 1.5270 | 1.5278 | 1.5287 | 1.5238 | 1.5246 | 1.5238 |
| $K_{IC}$ (MPa√) | 0.798 | 0.783 | 0.787 | 0.796 | 0.781 | 0.804 | 0.756 |
| Poisson's Ratio | 0.227 | 0.230 | 0.229 | 0.230 | 0.226 | 0.229 | 0.228 |
| Young's Modulus (GPa) | 81.85 | 82.61 | 82.54 | 82.47 | 81.10 | 81.16 | 81.16 |
| Shear Modulus(GPa) | 33.35 | 33.55 | 33.55 | 33.49 | 33.07 | 33.00 | 33.07 |
| Softening Point (° C.) | 818.2 | 813.3 | 813.5 | 814.0 | 831.9 | 831.4 | 829.7 |
| Strain Point (° C.) | 566.1 | 563.8 | 562.5 | 562.5 | 567.0 | 566.2 | 566.5 |
| Anneal Point (° C.) | 611.3 | 609.2 | 607.5 | 607.8 | 614.3 | 613.0 | 613.9 |

| Composition | VV | WW | XX | YY | ZZ |
|---|---|---|---|---|---|
| $SiO_2$ | 57.6 | 56.1 | 58.6 | 57.1 | 57.8 |
| $Al_2O_3$ | 18.2 | 18.9 | 17.4 | 18.6 | 18.0 |
| $B_2O_3$ | 5.0 | 5.1 | 5.0 | 5.0 | 5.0 |
| $Li_2O$ | 8.9 | 9.0 | 7.9 | 9.7 | 8.9 |
| $Na_2O$ | 6.8 | 6.9 | 4.8 | 2.8 | 5.8 |
| MgO | 2.0 | 2.0 | 2.0 | 3.9 | 2.0 |
| CaO | 0.0 | 1.0 | 2.1 | 0.0 | 1.0 |
| $TiO_2$ | 0.0 | 0.0 | 0.0 | 0.0 | 0.0 |
| $Y_2O_3$ | 1.5 | 1.0 | 2.0 | 2.0 | 1.0 |
| $ZrO_2$ | 0.0 | 0.0 | 0.0 | 0.6 | 0.6 |
| $SnO_2$ | 0.05 | 0.05 | 0.06 | 0.06 | 0.06 |
| MgO + CaO | 2.0 | 3.0 | 4.1 | 3.9 | 3.0 |
| $R_2O$ | 15.7 | 15.9 | 12.7 | 12.5 | 14.7 |
| R'O | 2.0 | 3.0 | 4.1 | 3.9 | 3.0 |
| $R_2O$ + R'O−$Al_2O_3$ | -0.5 | 0.0 | -0.6 | -2.2 | -0.3 |
| $Y_2O_3$ + $ZrO_2$ | 1.5 | 1.0 | 2.0 | 2.6 | 1.6 |

| Composition | VV | WW | XX | YY | ZZ |
|---|---|---|---|---|---|
| Density (g/cm$^3$) | 2.491 | 2.473 | 2.532 | 2.550 | 2.490 |
| Liquidus Temperature (° C.) | 1200 | 1245 | 1110 | 1200 | 1105 |
| Liquidus Phase | Keivyite | Xenotime | Keivyite | Corundum | Spinel |
| Liquidus Viscosity (kP) | 3.1 | 1.3 | 11.9 | 1.7 | 12.9 |
| SOC (nm/mm/MPa) | 2.949 | 2.929 | 2.877 | 2.816 | 2.914 |
| Refractive Index | 1.5260 | 1.5232 | 1.5341 | 1.5420 | 1.5290 |
| $K_{IC}$ (MPa√) | | 0.757 | 0.756 | 0.844 | 0.812 |
| Poisson's Ratio | 0.230 | 0.232 | 0.234 | 0.239 | 0.232 |
| Young's Modulus (GPa) | 81.30 | 80.20 | 85.09 | 88.67 | 83.58 |
| Shear Modulus(GPa) | 33.07 | 32.52 | 34.45 | 35.76 | 33.90 |
| Softening Point (° C.) | 818.5 | 805.7 | 829.7 | 829.0 | 820.1 |
| Strain Point (° C.) | 553.6 | 563.5 | 578.1 | 593.3 | 567.9 |
| Anneal Point (° C.) | 598.2 | 609.1 | 623.5 | 637.4 | 613.3 |

Substrates were formed from the compositions of Table I, and subsequently ion exchanged to form example articles. The ion exchange included submerging the substrates into a molten salt bath. The salt bath composition, temperature, and exposure time are reported in Table II. The compressive stress (CS), $DOL_K$, and maximum central tension (CT) of the ion exchanged articles were measured according to the methods described herein.

TABLE II

| | | IOX Bath | | | Time | CS | DOLK | CT |
|---|---|---|---|---|---|---|---|---|
| Article | Composition | $KNO_3$ (wt %) | $NaNO_3$ (wt %) | Temperature(° C.) | (hrs) | (MPa) | (um) | (MPa) |
| 1 | A | 80 | 20 | 430 | 8 | 634.1 | 8.57 | 111 |
| 2 | B | 80 | 20 | 430 | 8 | 612.5 | 6.64 | 117 |
| 3 | C | 80 | 20 | 430 | 8 | 659.1 | 6.12 | 131 |
| 4 | D | 80 | 20 | 430 | 8 | 708.9 | 6.05 | 123 |
| 5 | E | 80 | 20 | 430 | 12 | 608.3 | 7.38 | 113 |
| 6 | F | 80 | 20 | 430 | 8 | 665.8 | 9.61 | 118 |
| 7 | G | 80 | 20 | 430 | 8 | 665.9 | 8.41 | 125 |
| 8 | H | 80 | 20 | 430 | 8 | 677.0 | 8.35 | 126 |
| 9 | I | 80 | 20 | 430 | 4 | 758.7 | 5.62 | 103 |
| 10 | I | 80 | 20 | 430 | 8 | 653.6 | 8.10 | 119 |
| 11 | J | 80 | 20 | 430 | 8 | 655.9 | 8.23 | 122 |
| 12 | U | 90 | 10 | 430 | 12 | 770.0 | 5.60 | 156 |
| 13 | V | 90 | 10 | 430 | 12 | 787.0 | 4.80 | 145 |
| 14 | W | 90 | 10 | 430 | 12 | | | 131 |
| 15 | X | 90 | 10 | 430 | 12 | 830.0 | 4.30 | 144 |

TABLE II-continued

| Article | Composition | IOX Bath KNO$_3$ (wt %) | NaNO$_3$ (wt %) | Temperature(° C.) | Time (hrs) | CS (MPa) | DOLK (um) | CT (MPa) |
|---|---|---|---|---|---|---|---|---|
| 16 | GG | 80 | 20 | 430 | 8 | 571.0 | 7.90 | 110 |
| 17 | HH | 80 | 20 | 430 | 8 | 586.8 | 7.80 | 117 |
| 18 | II | 80 | 20 | 430 | 4 | 649.3 | 6.10 | 115 |
| 19 | JJ | 80 | 20 | 430 | 4 | 653.8 | 6.40 | 111 |
| 20 | JJ | 80 | 20 | 430 | 8 | 589.5 | 8.15 | 108 |
| 21 | KK | 80 | 20 | 430 | 4 | 676.3 | 6.25 | 118 |
| 22 | KK | 80 | 20 | 430 | 8 | 616.0 | 8.10 | 113 |
| 23 | LL | 80 | 20 | 430 | 4 | 684.8 | 6.20 | 105 |
| 24 | LL | 80 | 20 | 430 | 8 | 612.8 | 7.90 | 103 |
| 25 | MM | 80 | 20 | 430 | 4 | 792.0 | 5.80 | 121 |
| 26 | MM | 80 | 20 | 430 | 8 | 718.0 | 8.30 | 124 |
| 27 | NN | 80 | 20 | 430 | 4 | 802.0 | 5.10 | 127 |
| 28 | NN | 80 | 20 | 430 | 8 | 754.0 | 8.00 | 130 |
| 29 | 00 | 80 | 20 | 430 | 8 | 744.0 | 8.10 | 128 |
| 30 | PP | 80 | 20 | 430 | 4 | 825.9 | 5.20 | 131 |
| 31 | QQ | 80 | 20 | 430 | 4 | 833.0 | 5.90 | 133 |
| 32 | QQ | 80 | 20 | 430 | 8 | 778.0 | 8.40 | 124 |
| 33 | RR | 80 | 20 | 430 | 4 | 825.0 | 6.00 | 118 |
| 34 | RR | 80 | 20 | 430 | 8 | 757.0 | 8.60 | 121 |
| 35 | YY | 94 | 6 | 450 | 16 | 909.0 | 5.40 | 157 |
| 36 | ZZ | 88 | 12 | 430 | 16 | 922.0 | 6.70 | 120 |

All compositional components, relationships, and ratios described in this specification are provided in mol % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A glass, comprising:

greater than or equal to 50 mol % to less than or equal to 65 mol % $SiO_2$;

greater than or equal to 15 mol % to less than or equal to 21 mol % $Al_2O_3$;

greater than or equal to 4 mol % to less than or equal to 10 mol % $B_2O_3$;

greater than or equal to 7 mol % to less than 11 mol % $Li_2O$;

greater than or equal to 1 mol % to less than or equal to 10 mol % $Na_2O$;

greater than or equal to 0 mol % to less than or equal to 7 mol % MgO;

greater than or equal to 0 mol % to less than or equal to 5 mol % $Y_2O_3$; and greater than or equal to 0 mol % to less than or equal to 0.8 mol % $ZrO_2$, wherein:

the glass is substantially free of CaO;

$Y_2O_3$+$ZrO_2$ is greater than or equal to 0.2 mol %, and $R_2O$+R'O—$Al_2O_3$ is from greater than or equal to −2 mol % to less than or equal to 3 mol %, wherein $R_2O$ is the total amount of alkali oxides and R'O is the total amount of alkaline earth oxides.

2. The glass of claim 1, comprising greater than or equal to 15 mol % to less than or equal to 20 mol % $Al_2O_3$.

3. The glass of claim 1, wherein:

$$-2 \text{ mol } \% \leq R_2O + R'O - Al_2O_3 \leq 2 \text{ mol } \%.$$

4. The glass of claim 1, wherein:

both $Y_2O_3$ and $ZrO_2$ are present and $$0.2 \text{ mol } \% \leq Y_2O_3 + ZrO_2 \leq 5 \text{ mol } \%.$$

5. The glass of claim 1, wherein:

$$1 \text{ mol } \% \leq \text{MgO} \leq 6 \text{ mol } \%.$$

6. The glass of claim 1, comprising a $K_{1C}$ greater than or equal to 0.75 MPa$\sqrt{m}$.

7. A method comprising:

ion exchanging a glass-based substrate in a molten salt bath to form a glass-based article, wherein the glass-based article comprises a compressive stress layer extending from a surface of the glass-based article to a depth of compression, and the glass-based substrate comprises the glass of claim 1.

8. The method of claim 7, wherein the molten salt bath comprises $NaNO_3$ and $KNO_3$.

9. The method of claim 7, wherein the molten salt bath comprises greater than or equal to 75 wt % $KNO_3$ to less than or equal to 95 wt % $KNO_3$.

10. The method of claim 7, wherein the molten salt bath comprises greater than or equal to 5 wt % $NaNO_3$ to less than or equal to 25 wt % $NaNO_3$.

11. The method of claim 7, wherein the molten salt bath is at a temperature greater than or equal to 430° C. to less than or equal to 450° C.

12. The method of claim 7, wherein the ion exchanging extends for a time period greater than or equal to 4 hours to less than or equal to 12 hours.

13. A glass-based article, comprising:

a compressive stress layer extending from a surface of the glass-based article to a depth of compression;

a composition at a center of the glass-based article corresponds to the glass of claim 1.

14. The glass-based article of claim 13, wherein the composition at the center of the glass-based article comprises greater than or equal to 15 mol % to less than or equal to 20 mol % $Al_2O_3$.

15. The glass-based article of claim 13, wherein the composition at the center of the glass-based article comprises:

$$-2 \text{ mol } \% \leq R_2O + R'O - Al_2O_3 \leq 2 \text{ mol } \%.$$

16. The glass-based article of claim 13, wherein the composition at the center of the glass-based article comprises:

$$0.2 \text{ mol } \% \leq Y_2O_3 + ZrO_2 \leq 5 \text{ mol } \%.$$

17. The glass-based article of claim 13, wherein the composition at the center of the glass-based article comprises:

$$1 \text{ mol } \% \leq MgO \leq 6 \text{ mol } \%.$$

18. The glass-based article of claim 13, wherein a glass having the same composition and microstructure as the composition at the center of the glass-based article comprises a $K_{1C}$ greater than or equal to 0.75 MPa√m.

19. The glass-based article of claim 13, wherein the compressive stress layer comprises a compressive stress greater than or equal to 550 MPa.

20. The glass-based article of claim 13, further comprising a maximum central tension greater than or equal to 90 MPa to less than or equal to 160 MPa.

21. The glass-based article of claim 13, further comprising a potassium ion penetration layer extending from a surface of the glass-based article to a depth of potassium layer $DOL_K$, wherein $DOL_K$ is greater than or equal to 4 μm to less than or equal to 11 μm.

22. A consumer electronic product, comprising:

a housing having a front surface, a back surface and side surfaces;

electrical components provided at least partially within the housing, the electrical components including at least a controller, a memory, and a display, the display being provided at or adjacent the front surface of the housing; and a cover substrate disposed over the display, wherein at least a portion of at least one of the housing and the cover substrate comprises the glass-based article of claim 13.

23. A glass, comprising:

greater than or equal to 50 mol % to less than or equal to 65 mol % $SiO_2$;

greater than or equal to 15 mol % to less than or equal to 21 mol % $Al_2O_3$;

greater than or equal to 4 mol % to less than or equal to 10 mol % $B_2O_3$;

greater than or equal to 7 mol % to less than or equal to 12 mol % $Li_2O$;

greater than or equal to 1 mol % to less than or equal to 10 mol % $Na_2O$;

greater than or equal to 0 mol % to less than or equal to 7 mol % MgO;

greater than or equal to 0 mol % to less than or equal to 5 mol % CaO;

greater than or equal to 2.5 mol % to less than or equal to 5 mol % $Y_2O_3$; and greater than 0 mol % to less than or equal to 0.8 mol % $ZrO_2$, wherein:

$Y_2O_3$+$ZrO_2$ is greater than 2.5 mol %, and $R_2O$+R'O—$Al_2O_3$ is from greater than or equal to −2 mol % to less than or equal to 3 mol %, wherein $R_2O$ is the total amount of alkali oxides and R'O is the total amount of alkaline earth oxides.

24. A glass-based article, comprising:

a compressive stress layer extending from a surface of the glass-based article to a depth of compression;

a composition at a center of the glass-based article corresponding to the glass of claim 23.

25. The glass of claim 1, wherein $R_2O$+R'O-$Al_2O_3$ is from greater than or equal to −2 mol % to less than or equal to 0 mol %.

26. The glass of claim 25, wherein the glass exhibits a fracture toughness $K_{1C}$ greater than or equal to 0.90 MPa√m.

27. The glass of claim 6, wherein the $K_{1C}$ greater than or equal to 0.80 MPa√m.

28. The glass of claim 6, wherein the glass exhibits a fracture toughness $K_{1C}$ greater than or equal to 0.90 MPa√m.

29. The glass of claim 1, comprising greater than or equal to 2.5 mol % to less than or equal to 5 mol % $Y_2O_3$.

30. The glass of claim 23, wherein the glass is substantially free of CaO.

* * * * *